United States Patent
Fusella et al.

(10) Patent No.: US 11,139,442 B2
(45) Date of Patent: *Oct. 5, 2021

(54) NANOPATCH ANTENNA OUTCOUPLING STRUCTURE FOR USE IN OLEDS

(71) Applicant: Universal Display Corporation, Ewing, NJ (US)

(72) Inventors: Michael Fusella, Lawrenceville, NJ (US); Nicholas J. Thompson, New Hope, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/814,858

(22) Filed: Mar. 10, 2020

(65) Prior Publication Data

US 2020/0295288 A1 Sep. 17, 2020

Related U.S. Application Data

(60) Provisional application No. 62/817,368, filed on Mar. 12, 2019, provisional application No. 62/817,284, (Continued)

(51) Int. Cl.
*H01L 51/50* (2006.01)
*H01Q 9/04* (2006.01)

(52) U.S. Cl.
CPC ......... *H01L 51/502* (2013.01); *H01Q 9/0442* (2013.01)

(58) Field of Classification Search
CPC .............. H01L 51/502; H01L 51/5262; H01L 2251/5369; H01Q 1/2283
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |

(Continued)

FOREIGN PATENT DOCUMENTS

| | | |
|---|---|---|
| EP | 3168890 A1 | 5/2017 |
| WO | 2006095951 | 9/2006 |

(Continued)

OTHER PUBLICATIONS

Baldo et al. Highly efficient phosphorescent emission from organic electroluminescent devices, Nature, vol. 395, pp. 151-154, 1998.

(Continued)

*Primary Examiner* — Nicholas J Tobergte
(74) *Attorney, Agent, or Firm* — Butzel Long

(57) ABSTRACT

Embodiments of the disclosed subject matter provide an emissive layer, a first electrode layer, a plurality of nanoparticles and a material disposed between the first electrode layer and the plurality of nanoparticles. In some embodiments, the device may include a second electrode layer and a substrate, where the second electrode layer is disposed on the substrate, and the emissive layer is disposed on the second electrode layer. In some embodiments, a second electrode layer may be disposed on the substrate, the emissive layer may be disposed on the second electrode layer, the first electrode layer may be disposed on the emissive layer, a first dielectric layer of the material may be disposed on the first electrode layer, the plurality of nanoparticles may be disposed on the first dielectric layer, and a second dielectric layer may be disposed on the plurality of nanoparticles and the first dielectric layer.

20 Claims, 20 Drawing Sheets

Related U.S. Application Data filed on Mar. 12, 2019, provisional application No. 62/817,424, filed on Mar. 12, 2019, provisional application No. 62/870,272, filed on Jul. 3, 2019.

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,750,352 B2 * | 7/2010 | Thurk ............ G09F 13/22 257/79 |
| 7,968,146 B2 | 6/2011 | Wagner |
| 8,557,400 B2 | 10/2013 | Xia |
| 9,318,721 B2 * | 4/2016 | Carroll ............ H01L 51/5028 |
| 9,960,386 B2 | 5/2018 | Thompson |
| 10,522,787 B1 * | 12/2019 | Montgomery ...... H01L 51/5218 |
| 10,600,980 B1 * | 3/2020 | Boardman ......... H01L 51/5206 |
| 10,663,631 B2 * | 5/2020 | Mikkelsen ......... H01L 33/06 |
| 2003/0230980 A1 | 12/2003 | Forrest |
| 2004/0174116 A1 | 9/2004 | Lu |
| 2011/0037057 A1 | 2/2011 | Lecloux |
| 2013/0146878 A1 | 6/2013 | Oh |
| 2015/0041780 A1 | 2/2015 | Ma |
| 2017/0133631 A1 | 5/2017 | Thompson |
| 2017/0229663 A1 | 8/2017 | Tsai |
| 2017/0299784 A1 | 10/2017 | Mikkelsen |
| 2017/0324057 A1 | 11/2017 | Friend |
| 2019/0081248 A1 | 3/2019 | Lin |
| 2020/0295093 A1 * | 9/2020 | Thompson ......... H01L 51/5262 |

FOREIGN PATENT DOCUMENTS

| | | |
|---|---|---|
| WO | 2008057394 A1 | 5/2008 |
| WO | 2010011390 A2 | 1/2010 |
| WO | 2016108990 A2 | 7/2016 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Akselrod et al., "Probing the mechanisms of large Purcell enhancement in plasmonic nanoantennas", nature photonics, published online Oct. 12, 2014, p. 1-6.

Atzrodt et al., "The Renaissance of H/D Exchange", Angewandte Chemie, Angew. Chem. Int. Ed. 2007, 46, 7744-7765.

George et al., "Electrically tunable diffractiion efficiency from gratings in Al-doped ZnO", Applied Physics Letters 110, 071110, 2017.

Hu et al., "A convenient synthesis of deuterium labeled amines and nitrogen heterocycles with KOt-Bu/DMSO-d6", Elsevier, Tetrahedron 71, 2015, 1425-1430.

Lassiter et al., "Plasmonic waveguide modes of film-coupled metallic nanocubes", Nano Letters, 201, 3, 13, 5866-5872downloaded via Universal Display Corp on Aug. 31, 2018, https://pubs.acs.org/sharingguidelines.

European Extended Search Report issued in EP20162531.6, dated Jul. 10, 2020, 9 pages.

In-Hwan Lee et al: "Performance enhancement of GaN-based light emitting diodes by the interaction with localized surface plasmons", Nano Energy, vol. 13, Apr. 1, 2015 (Apr. 1, 2015), pp. 140-173, XP055708113, ISSN: 2211-2855.

Kevin C.Y. Huang et al: "Antenna electrodes for controlling electroluminescence", Nature Communications, vol. 3, Aug. 14, 2012 (Aug. 14, 2012), p. 1005.

* cited by examiner a)

b)

Two individual NPAs highlighted in dashed boxes.

a)

b)

c)

d)

e)

f)

NANOPATCH ANTENNA OUTCOUPLING STRUCTURE FOR USE IN OLEDS

CROSS-REFERENCE TO RELATED APPLICATIONS

This application claims priority to U.S. Patent Application Ser. No. 62/817,284, filed Mar. 12, 2019, U.S. patent application Ser. No. 62/870,272 filed Jul. 3, 2019, U.S. Patent Application Ser. No. 62/817,368, filed Mar. 12, 2019, and U.S. Patent Application Ser. No. 62/817,424, filed Mar. 12, 2019, the entire contents of each are incorporated herein by reference.

FIELD

The present invention relates to outcouplings having a nanopatch antenna to convert a surface plasmon energy in an electrode layer of the OLED to visible light.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include an emissive layer, a first electrode layer, a plurality of nanoparticles, and a material disposed between the first electrode layer and the plurality of nanoparticles.

The device may include a second electrode layer and a substrate, where the second electrode layer may be disposed on the substrate, and the emissive layer may be disposed on the second electrode layer. At least one of the first electrode layer and the second electrode layer may be a metal, a semiconductor, and/or a transparent conducting oxide. The first electrode layer may be spaced from the emissive layer by a predetermined threshold distance that is a distance at which a total non-radiative decay rate constant is equal to a total radiative decay rate constant. The material of the device may include at least one of organic material, oxides, and/or dielectric material. The material may have a refractive index from 1-5. The emissive layer of the device may include a transport layer. The emissive layer may be an organic layer with emitter molecules.

The emissive layer of the device may include at least one of a fluorescent material, a phosphorescent material, a thermally-activated delayed fluorescence (TADF) material, a quantum dot material, metal-organic frameworks, covalent-organic frameworks, and/or perovskite nanocrystals.

The first electrode layer of the device may have a thickness from 5 nm to 300 nm. The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer may be selected to tune a plasmonic resonance wavelength of the plurality of nanoparticles or a nanopatch antenna. A shape of the plurality of nanoparticles may be at least one of cubes, spheres, spheroids, cylindrical, parallelpiped, rod-shaped, star-shaped, pyramidal, and/or multi-faceted three-dimensional objects. A size of at least one of the plurality of nanoparticles may be from 5 nm to 1000 nm.

The device may include a corrugated layer disposed on the substrate, where the second electrode layer, the emissive layer, the first electrode layer, and/or the material are correspondingly corrugated.

The material of the device may include a dielectric layer disposed on the first electrode layer, and an electrical contact layer disposed on the dielectric layer. The material may include a voltage-tunable refractive index material between the electrical contact layer and the first electrode layer. The voltage-tunable refractive index material may be aluminum-doped zinc oxide. The material may include an insulating layer. The first electrode layer of the device may be spaced from the emissive layer by a predetermined threshold distance.

The predetermined threshold distance may be a distance at which a total non-radiative decay rate constant is equal to a total radiative decay rate constant. The device may include an additional layer disposed on the plurality of nanoparticles. The additional layer may include one or more emitter molecules. The additional layer may match a refractive index beneath the first electrode layer. The additional layer has a thickness of 1000 nm or less.

The material of the device may include the emissive layer. The plurality of nanoparticles and the first electrode layer may provide an electrical injection pathway to the device.

The device may include a substrate, and a second electrode layer, where the first electrode layer may be non-planar, where the second electrode layer may be disposed on the substrate, and the plurality of nanoparticles may be disposed on the second electrode layer, where the emissive layer may be non-planar and may be included in the material, and may be disposed on and conforms to the plurality of nanoparticles and the second electrode layer, and where the first electrode layer may be disposed on and conforms to the non-planar emissive layer. At least one of the first electrode layer and the second electrode layer may be a metal, a semiconductor, and/or a transparent conducting oxide.

The device may include a substrate and a second electrode layer, where the second electrode layer may be disposed on the substrate, and the nanoparticles may be disposed in the second electrode layer, where the emissive layer may be included in the material, and may be disposed on the second electrode layer that includes the plurality of nanoparticles, and where the first electrode layer is disposed on the emissive layer. At least one of the first electrode layer and the second electrode layer may be a metal, a semiconductor, and/or a transparent conducting oxide.

The device may include a substrate and a second electrode layer, the material may be a first dielectric layer, and the device may include a second dielectric layer, where the second electrode layer may be disposed on the substrate, the emissive layer may be disposed on the second electrode layer, the first electrode layer may be disposed on the emissive layer, the first dielectric layer may be disposed on the first electrode layer, the plurality of nanoparticles may be disposed on the first dielectric layer, and the second dielectric layer may be disposed on the plurality of nanoparticles and the first dielectric layer. At least one of the first electrode layer and the second electrode layer may be a metal, a semiconductor, and/or a transparent conducting oxide. The first electrode layer may be spaced from the emissive layer by a predetermined threshold distance that is a distance at which a total non-radiative decay rate constant is equal to a total radiative decay rate constant. The first electrode layer may include at least one of Ag, Al, Au, Ir, Pt, Ni, Cu, W, Ta, Fe, Cr, Mg, Ga, Rh, Ti, Ru, Pd, In, Bi, and/or Ca. The material may include at least one of organic material, oxides, and/or dielectric material. The material may have a refractive index from 1-5. The emissive layer may include a transport layer. The emissive layer may be an organic layer with emitter molecules. The emissive layer may include at least one of a fluorescent material, a phosphorescent material, a thermally-activated delayed fluorescence (TADF) material, a quantum dot material, metal-organic frameworks, covalent-organic frameworks, and/or perovskite nanocrystals. The first electrode layer may have a thickness from 5 nm to 100 nm. The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer. The plurality of nanoparticles may be formed from at least one selected from the group consisting of: Ag particles, Al particles, Au particles, dielectric material, semiconductor materials, an alloy of metal, a mixture of dielectric materials, a stack of one or more materials, and/or a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer is selected to tune a plasmonic resonance wavelength of the plurality of nanoparticles or a nanopatch antenna. A shape of the plurality of nanoparticles may be at least one of cubes, spheres, spheroids, cylindrical, parallelpiped, rod-shaped, star-shaped, pyramidal, and/or multi-faceted three-dimensional objects. A size of at least one of the plurality of nanoparticles may be from 5 nm to 1000 nm.

The device may include a substrate and a second electrode layer, where the material may be a first dielectric layer, where the second electrode layer may be disposed on the substrate, the emissive layer may be disposed on the second electrode layer, the first electrode layer may be disposed on the emissive layer, the first dielectric layer may be disposed on the first electrode layer, and the plurality of nanoparticles may be disposed on the first dielectric layer. At least one of the first electrode layer and the second electrode layer may be a metal, a semiconductor, and/or a transparent conducting oxide.

The device may include a substrate and a second electrode layer, where the material is a first dielectric layer, and a second dielectric layer, where the plurality of nanoparticles may be disposed in the second dielectric layer, and where the second dielectric layer and the plurality of nanoparticles may be disposed on the substrate, the first dielectric layer may be disposed on the second dielectric layer and the plurality of nanoparticles, the first electrode layer may be disposed on the first dielectric layer, the emissive layer may be disposed on the first electrode, and the second electrode may be disposed on the emissive layer. At least one of the first electrode layer and the second electrode layer may be a metal, a semiconductor, and/or a transparent conducting oxide.

The device may include a substrate and a second electrode layer, the material may be a first dielectric layer, the device may include a second dielectric layer, and the first electrode layer may be disposed on the substrate, the first dielectric layer may be disposed on the first electrode layer, the plurality of nanoparticles may be disposed on the first dielectric layer, the second dielectric layer may be disposed on the plurality of nanoparticles and the first dielectric layer, the emissive layer may be disposed on the second dielectric layer, and the second electrode layer may be disposed on the emissive layer. At least one of the first electrode layer and the second electrode layer may be a metal, a semiconductor, and/or a transparent conducting oxide.

The device may include a substrate and a second electrode layer, the material is a first dielectric layer, and the device may include a second dielectric layer, where the second electrode layer may be disposed on the substrate, the emissive layer may be disposed on the second electrode layer, the plurality of nanoparticles may be disposed on the emissive layer, the second dielectric layer may be disposed on the plurality of nanoparticles and the emissive layer, the first dielectric layer may be disposed on the second dielectric layer, and the first electrode layer is disposed on the first dielectric layer. At least one of the first electrode layer and the second electrode layer may be a metal, a semiconductor, and/or a transparent conducting oxide.

The material of the device may include at least one of organic material, oxides, and/or dielectric material. The material may include a first layer and a second layer, where the first layer is thicker than the second layer. The first layer may be a dielectric material, and the second layer may be a nanoparticle adhesion layer. The thickness of the first layer may be between 1 to 100 nm, and the thickness of the second layer may be less than 5 nm. The material may have a thickness of 1000 nm or less. The material of the device may have a refractive index from 1-5. The material may include a least a portion of a coating disposed on the plurality of nanoparticles. The coating disposed on the plurality of nanoparticles may be a dielectric coating.

The device may include a second electrode layer, where the emissive layer is included in an organic light emitting diode (OLED), and where the OLED is disposed between the first electrode layer and the second electrode layer. At least one of the first electrode layer and the second electrode layer may be a metal, a semiconductor, and/or a transparent conducting oxide. The emissive layer may include a transport layer. The emissive layer may be an organic layer with emitter molecules. The emissive layer may include at least one of fluorescent material, phosphorescent material, thermally-activated delayed fluorescence (TADF) material, a quantum dot material, metal-organic frameworks, covalent-organic frameworks, and/or perovskite nanocrystals.

The first electrode layer of the device may be spaced from the emissive layer by a predetermined threshold distance, wherein the threshold distance is a distance at which a total non-radiative decay rate constant is equal to a total radiative decay rate constant. The first electrode layer may include at least one of Ag, Al, Au, Ir, Pt, Ni, Cu, W, Ta, Fe, Cr, Mg, Ga, Rh, Ti, Ru, Pd, In, Bi, and/or Ca. The first electrode layer may be patterned with an additional material. The additional material may include a light emitting element of a fluorescent emitter, a phosphorescent emitter, quantum dots, metal-organic frameworks, covalent-organic frameworks, and/or perovskite nanocrystals. The first electrode layer may has a thickness from 5 nm to 300 nm. The first electrode layer of the device may have at least one nonplanar surface.

The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer.

The plurality of nanoparticles of the device may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material.

At least one of the plurality of nanoparticles of the device may include an additional layer to provide lateral conduction among the plurality of nanoparticles. The plurality of nanoparticles may be coated with an oxide layer, where a thickness of the oxide layer is selected to tune a plasmonic resonance wavelength of the plurality of nanoparticles or a nanopatch antenna. The plurality of nanoparticles may be colloidally-synthesized nanoparticles formed from a solution. A shape of the plurality of the nanoparticles may be at least one of cubes, spheres, spheroids, cylindrical, parallelpiped, rod-shaped, star-shaped, pyramidal, and/or multi-faceted three-dimensional objects. A size of at least one of the plurality of nanoparticles may be from 5 nm to 1000 nm. The size of at least one of the plurality of nanoparticles may be from 5 nm to 200 nm. The size of at least one of the plurality of nanoparticles may be from 5 nm to 100 nm.

According to an embodiment, a method may be provided that includes disposing a first electrode layer on a substrate, disposing photoresist on the first electrode layer, etching at least a portion of the photoresist and the first electrode layer, depositing a metal on the portions of the photoresist that remain, and to match the depth of the etched portion of the first electrode layer, removing the metal and the photoresist so as to form nanoparticles from the deposited metal that are flush with a surface of the first electrode layer, disposing an emitting layer on the first electrode layer and the nanoparticles, and disposing a second electrode layer on the emitting layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
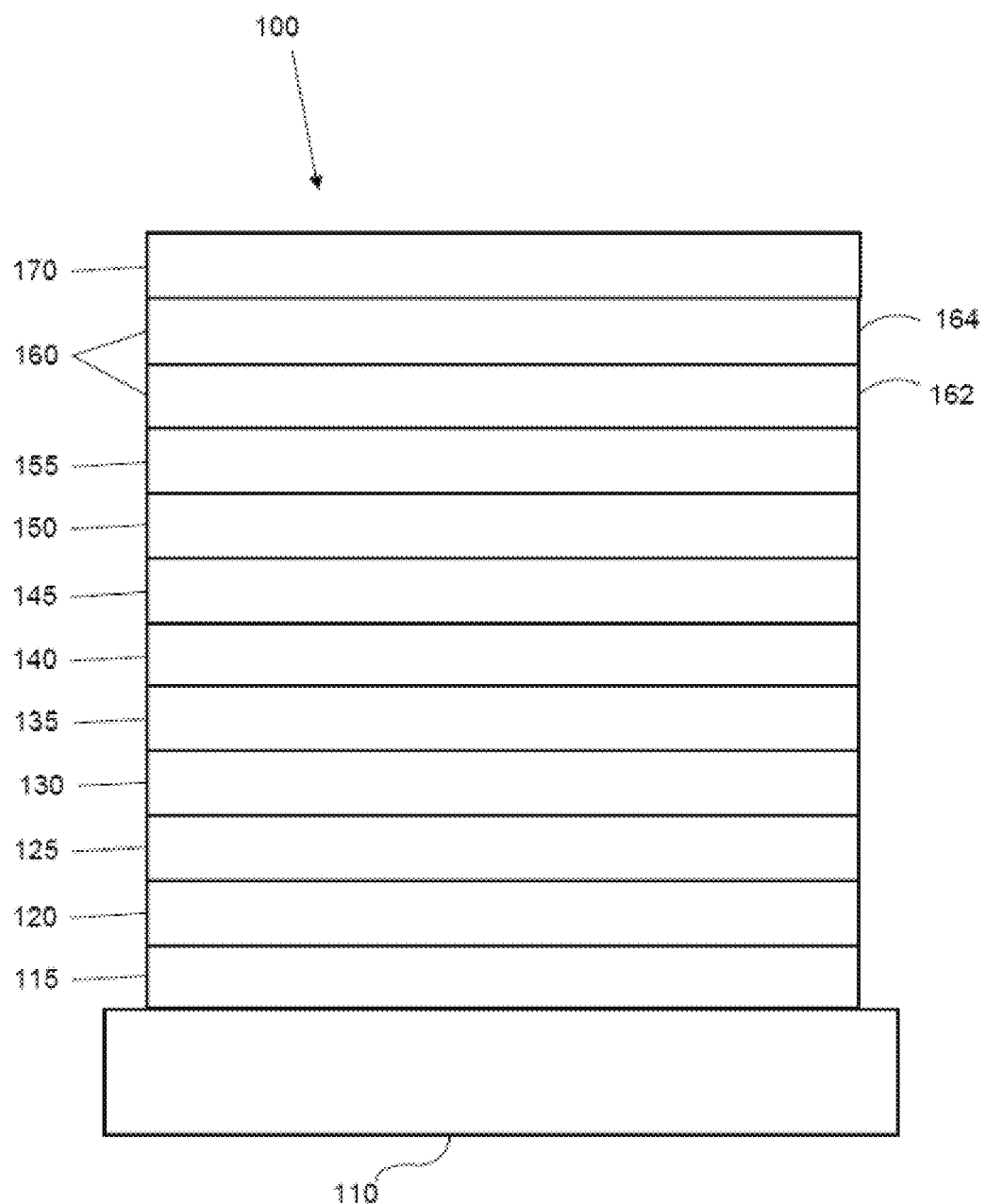
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
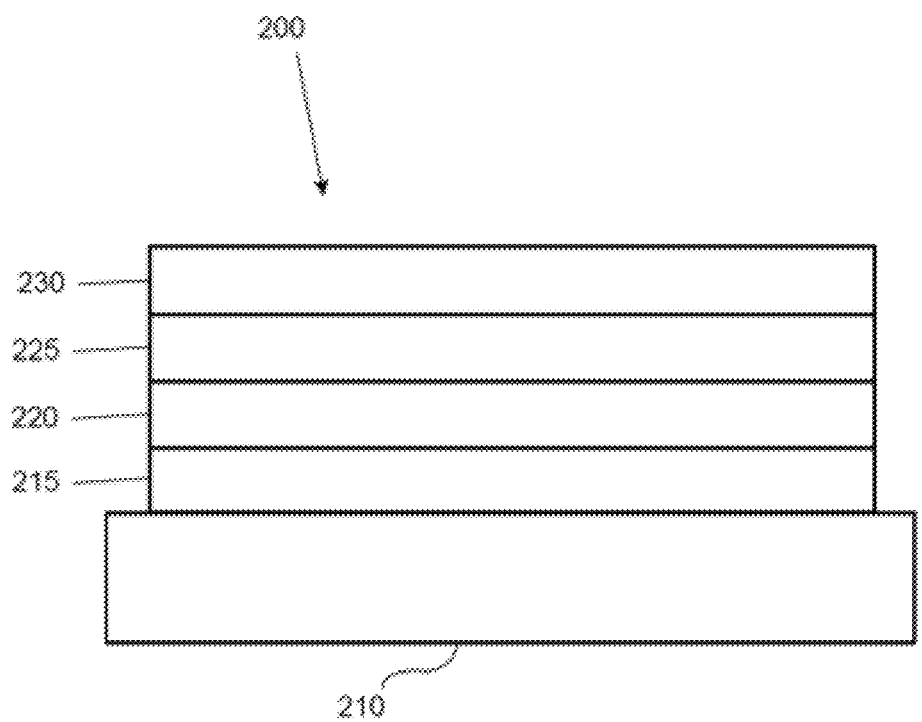
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Outcoupling energy in the form of light from the SPR (surface plasmon energy) mode may be used to provide OLEDs that live longer at display brightness if the emissive layer is within a threshold distance of a plasmonically-active material, such as a metal cathode and/or anode (e.g., electrode layers). The threshold distance may be the distance at which the total non-radiative decay rate constant is equal to the total radiative decay rate constant, as disclosed in U.S. Pat. No. 9,960,386 and incorporated by reference in its entirety.

Embodiments of the disclosed subject matter may convert energy stored in the SPR mode of a plasmonically-active material to visible light via a nanopatch antenna.

Figure 3A:
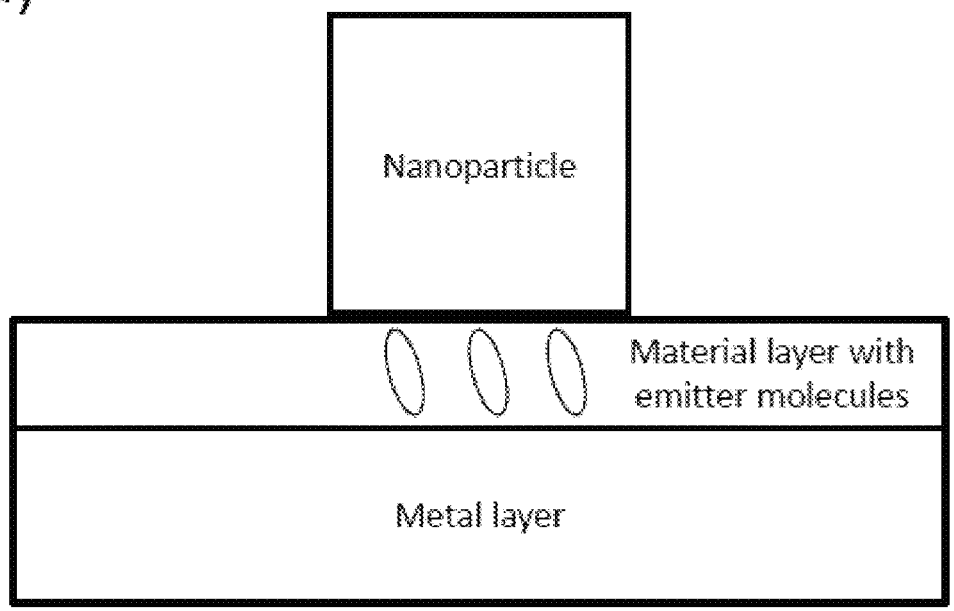
FIG. 3a shows a conventional nanopatch antenna, including a material layer with emitter molecules embedded therein between the nanoparticle and metal layer.
Figure 3B:
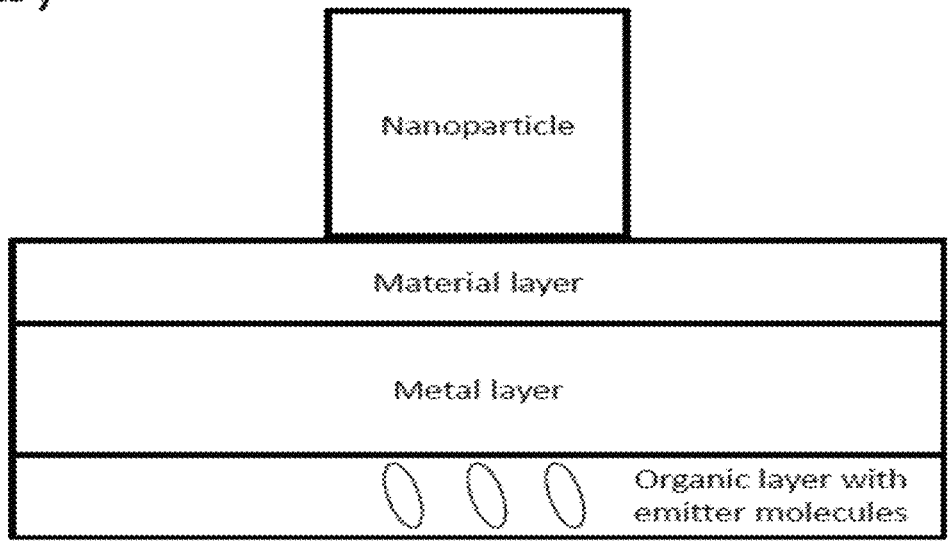
FIG. 3b shows a nanopatch antenna, including emitter molecules in an emissive layer are disposed beneath the metal layer (i.e., the electrode layer) according to an embodiment of the disclosed subject matter.
Figure 3C:
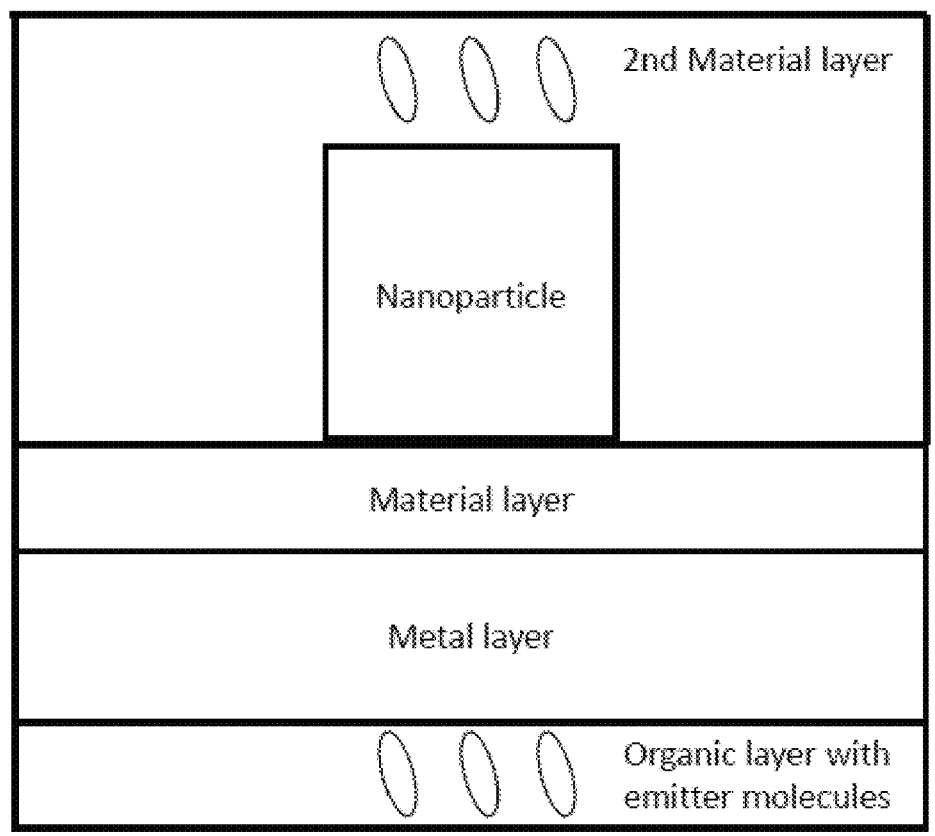
FIG. 3c shows a nanopatch antenna including a capping layer disposed on the nanoparticle, which may include additional emitter molecules, according to an embodiment of the disclosed subject matter.

The nanopatch antenna may include a planar metal film (e.g., an electrode layer), a gap material (e.g., a dielectric material or the like) disposed on the planar metal, and a nanoparticle disposed on the gap material, as shown in FIGS. 3a-3c. FIG. 3a shows a conventional nanopatch antenna that includes a gap layer with emitter molecules embedded therein between the nanoparticle and metal layer. FIG. 3b shows a nanopatch antenna according to an embodiment of the disclosed subject matter, where emitter molecules in the emissive layer are placed beneath the metal layer (i.e., not in the gap layer). FIG. 3c shows another embodiment of the disclosed subject matter, which includes a capping layer disposed atop the nanoparticle. In some embodiments, the capping layer may include additional emitter molecules.

Figure 4A:
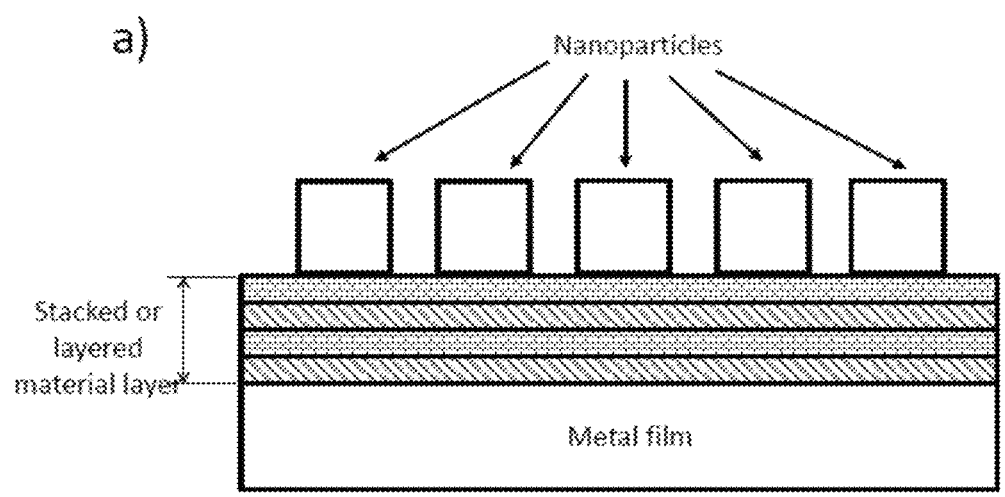
FIG. 4a shows a dielectric gap material including a plurality layers according to an embodiment of the disclosed subject matter.

The gap material may be organic (e.g., small molecule and/or polymer material), may include oxides, and/or other dielectric materials, including stacks, alloys, and/or mixtures of materials as shown, for example, in FIG. 4a. That is, FIG. 4a shows a dielectric gap material having a plurality of layers. This configuration may provide a resonant plasmon mode in the gap due to the high electric field intensity created in the gap medium. This large electric field may be used to enhance the emission rate of an emitter placed in the gap, known as the Purcell effect. The nanopatch antenna may radiate out the energy from this plasmonically-active mode with efficiencies up to 50%.

Figure 4B:
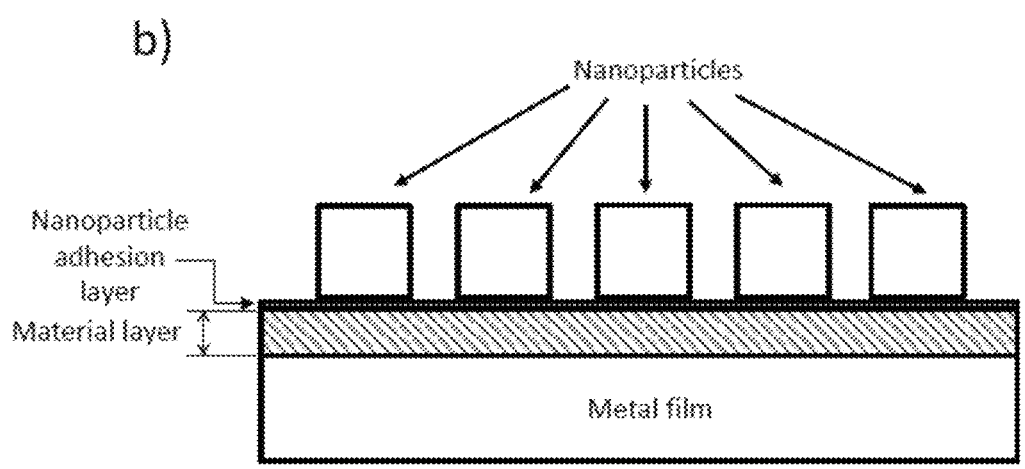
FIG. 4b shows a two-layer gap including a thick dielectric layer and a thin nanoparticle adhesion layer according to an embodiment of the disclosed subject matter.

In an embodiment of the disclosed subject matter, a stacked gap layer include two layers, with one thicker layer, which may be the primary dielectric gap material, and one thin layer that may act as a nanoparticle adhesion layer to increase nanoparticle density and/or reduce nanoparticle aggregation or clumping, as shown in FIG. 4b. For example, polyelectrolyte layers (such as poly(styrenesulfonate) or poly(allylamine) hydrochloride) may carry an electrostatic charge that may interact with the electrostatic charge on a nanoparticle coating (for example, poly(vinylpyrrolidinone), which may be used to coat silver nanoparticles, carries a negative electrostatic charge). While the summation of the thicknesses of these layers may determine the overall gap thickness, the adhesion layer thicknesses may be less than 5 nm, and gap layer thicknesses may be between 1 to 100 nm, and more preferably between 1 to 50 nm.

While Purcell factors on the order of 1000 may be achieved by placing an emitter in the nanopatch antenna gap, Purcell factors on the order of 10 may be sufficient for an enhancement in phosphorescent OLED emitter stability. It may be difficult to fabricate an entire OLED stack that maintains high internal quantum efficiency within the typical nanopatch antenna gap thickness, typically 2-15 nm, much less utilize the nanoparticle as one of the OLED electrodes. Embodiments of the disclosed subject matter may provide an arrangement where the emitter is placed beneath the planar metal, instead of in the antenna gap, as shown in FIG. 3b. A variation of this arrangement may include an additional capping layer disposed on the nanoparticle that may include additional emitter molecules, as shown in FIG. 3c. The capping layer may match the refractive index with the other side of the metal layer, thereby improving cross-coupling of the SPR mode across the metal layer and into the nanopatch antenna gap.

As shown in the arrangements of FIGS. 3b-3c, the emitter may be placed such that it is within a threshold distance of the planar metal, which, in turn, acts as one of the OLED contacts (i.e., either a cathode or anode). In one example, the emission may occur from the same side of the device as the nanoparticles, which makes this arrangement amenable to both top and bottom emission geometries.

Figure 5A:
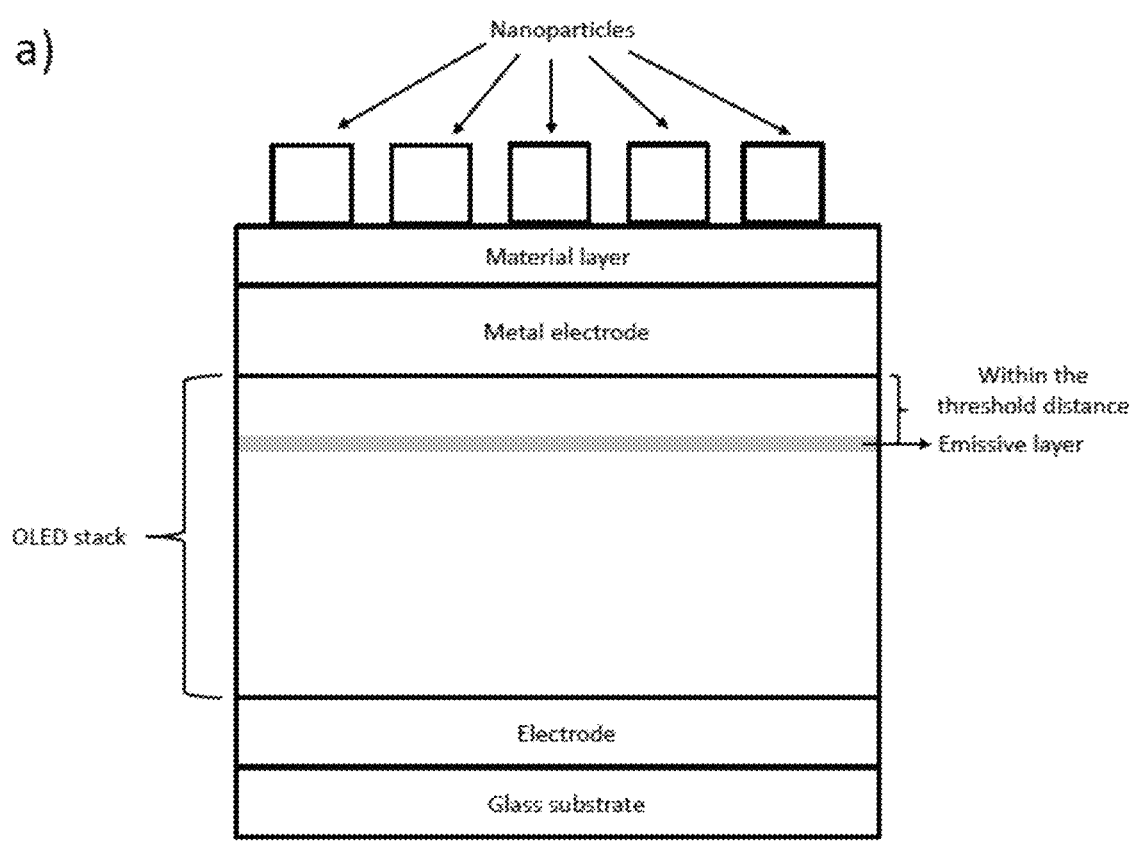
FIG. 5a shows emitter molecules in the emissive layer that are placed beneath the metal layer (i.e., the electrode layer) in combination with an OLED stack, where the emissive layer is within a threshold distance to the metal electrode, and the nanopatch antenna atop the electrode radiates out the side with the nanoparticles according to an embodiment of the disclosed subject matter.

In this configuration, the Purcell enhancement that stabilizes the emitter may originate from its proximity to the planar metal contact (e.g., an electrode layer). FIG. 5a shows an embodiment of the disclosed subject matter, where the emitter molecules in the emissive layer placed beneath the metal layer (i.e., not in the gap layer) may be combined with a conventional OLED stack where the emissive layer is within a threshold distance to the metal cathode, and the subsequent nanopatch antenna geometry atop the cathode radiates out the side with the nanoparticles.

Figure 5B:
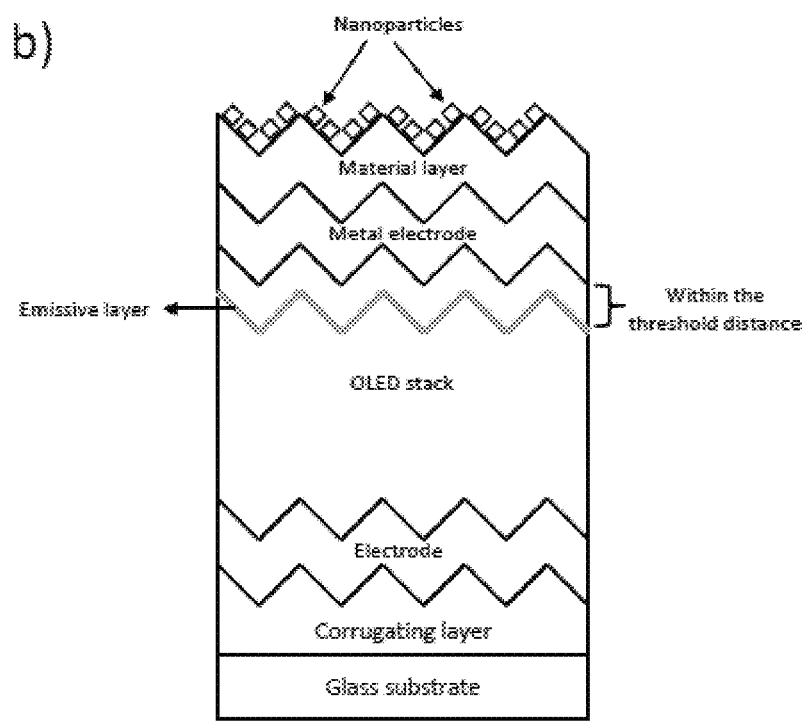
FIG. 5b shows a variation of the embodiment of FIG. 5a, where the stack may be corrugated for additional outcoupling of the SPR (surface plasmon energy) mode according to an embodiment of the disclosed subject matter.

In a variation of this configuration, the metal contact or the entire device stack may be corrugated to enhance the outcoupling of the SPR mode, as shown in FIG. 5b. This configuration may reduce the maximum achievable Purcell enhancement below those achieved by placing the emitter within the gap, but Purcell factors of ≥10 may still be achieved. By placing the emitter within a threshold distance of the metal (e.g., an electrode layer), the emitter energy may be coupled into the SPR mode induced along the metal's surface. For non-opaque metal films (e.g., Ag<200 nm thick, Al and Au<100 nm thick), this plasmon mode may couple to the opposite side of the metal where it may transfer its energy into the gap plasmon mode, and be converted to light via the nanopatch antenna, as shown in FIG. 6.

Figure 6:
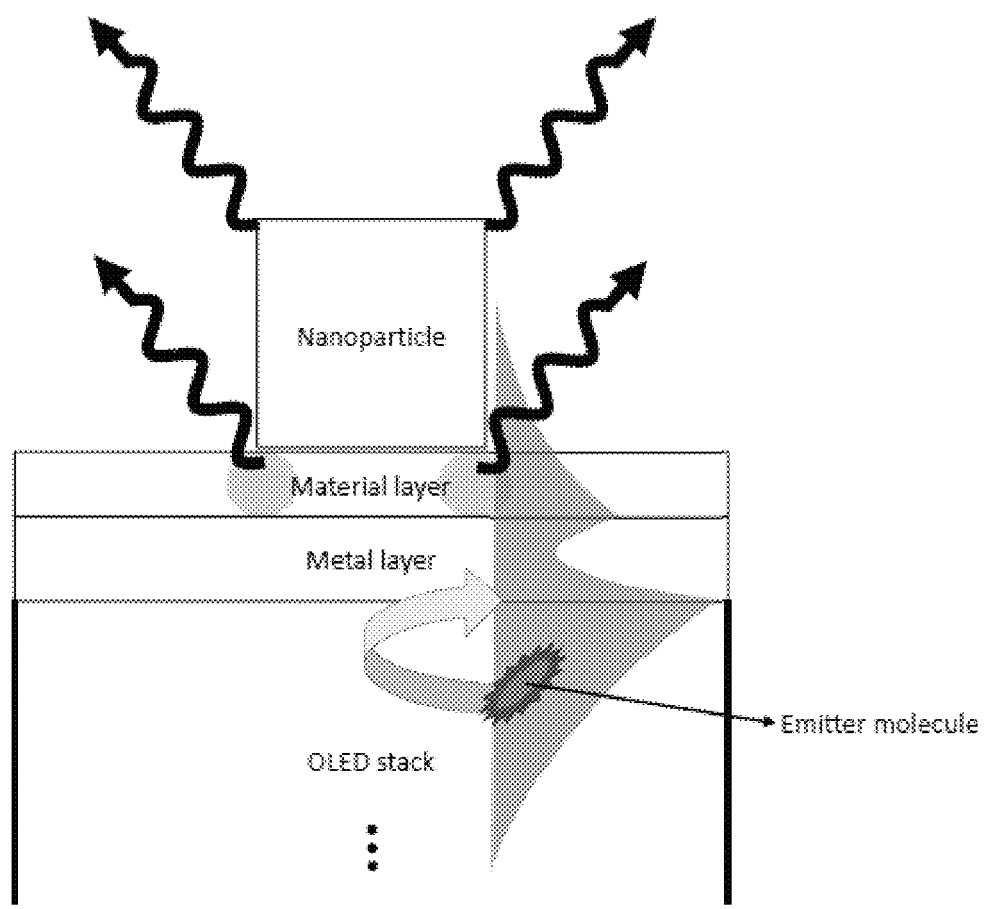
FIG. 6 shows that an excited emitter molecule's energy may be quenched to the SPR mode in the cathode, resulting in an electric field that may couple to the nanopatch antenna gap mode, and radiate out the energy as light according to an embodiment of the disclosed subject matter.

That is, FIG. 6 shows where energy is funneled through the SPR mode to be radiated as light. The excited emitter molecule's energy is quenched to the SPR mode in the cathode, resulting in an electric field that is, in turn, able to couple to the nanopatch antenna gap mode, and radiate out the energy as light.

Figure 7:
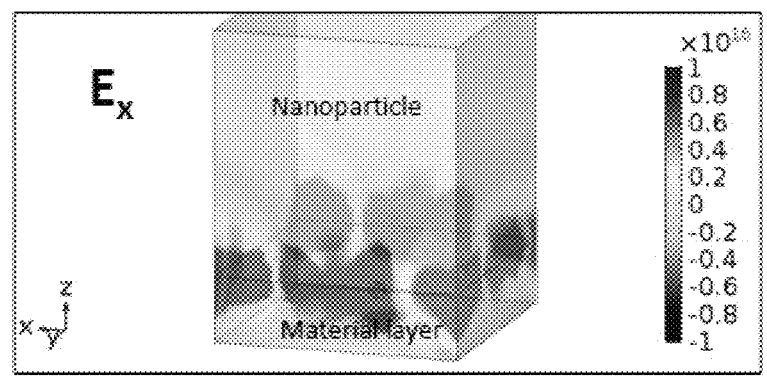
FIG. 7 shows a computer simulation of the electric field intensity in the x- and y-directions, Ex and Ey, respectively, in the material layer of a nanopatch antenna utilizing a nanocube as the nanoparticle, where the light outcoupled to the far field originates from the edge of the nanoparticle, according to an embodiment of the disclosed subject matter.
Figure 7:
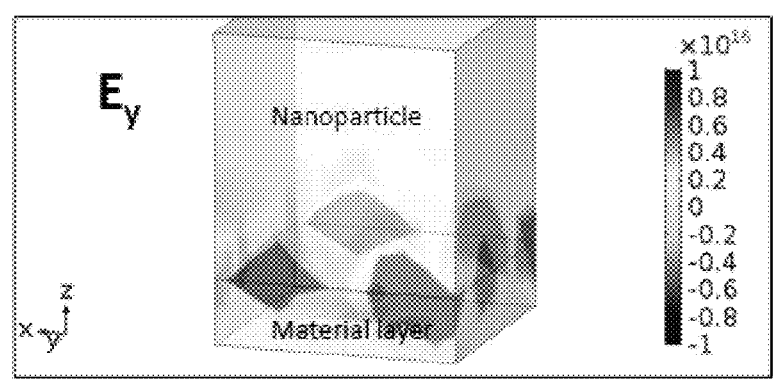

When a nanocube is used as the nanoparticle in the nanopatch antenna, the strength of the electric field may be highest at the corners of the nanocube, as shown in the simulations in FIG. 7. That is, FIG. 7 shows a simulation of the electric field intensity in the x- and y-directions, Ex and Ey, respectively, in the gap layer of a nanopatch antenna utilizing a nanocube as the nanoparticle. FIG. 7 shows that the light outcoupled to the far field originates from the edge of the nanoparticle.

Tuning the resonance of the nanopatch antenna to align with the emission spectrum of the phosphor may be for efficient conversion of the plasmon energy to light. Such tuning may be accomplished by any number of methods, including, but not limited to, varying the nanoparticle size, varying the nanoparticle shape (typical shapes are cubes, spheres, rods, disks, plates, stars, and modifications of these shapes with additional facets), changing the nanoparticle material (metal or dielectric), adjusting the thickness of the gap, changing the refractive index of the gap or the surrounding environment (for example, by depositing an additional capping layer atop the nanoparticles), and varying the planar metal thickness or metal type (e.g., where the metals may be Ag, Al, and/or Au, with a thicknesses range from 5 nm to 100 nm). An ordered array of nanoparticles may be used to enhance outcoupling efficiency, and/or to tune the resonant wavelength.

The planar metal film (e.g., an electrode layer) and/or metal nanoparticles may be pure or an alloy, preferably of Ag, Al, Ag—Al alloys, or Au. Some other materials include, but are not limited to Ir, Pt, Ni, Cu, W, Ta, Fe, Cr. The nanoparticles, additionally, may consist entirely of dielectric materials, may be an alloy of metal and dielectric materials, or may have a core of one type of material and be coated with a shell of a different type of material.

Gap thicknesses (e.g., material thickness) may be from 0-150 nm, and more preferably from 0-50 nm. When the gap is 0 nm (i.e., no gap), the nanoparticles may be disposed on the planar metal (e.g., the electrode layer) and may have a corrugation form to outcouple the SPR energy. Nanoparticle sizes for scattering out light in the visible part of the spectrum range (e.g., 400-700 nm wavelength) may be from 5 nm to 1000 nm, depending on the nanoparticle material and shape. The gap may be a dielectric material, such as an organic or metal oxide, with a refractive index from 1-5.

Figure 8:
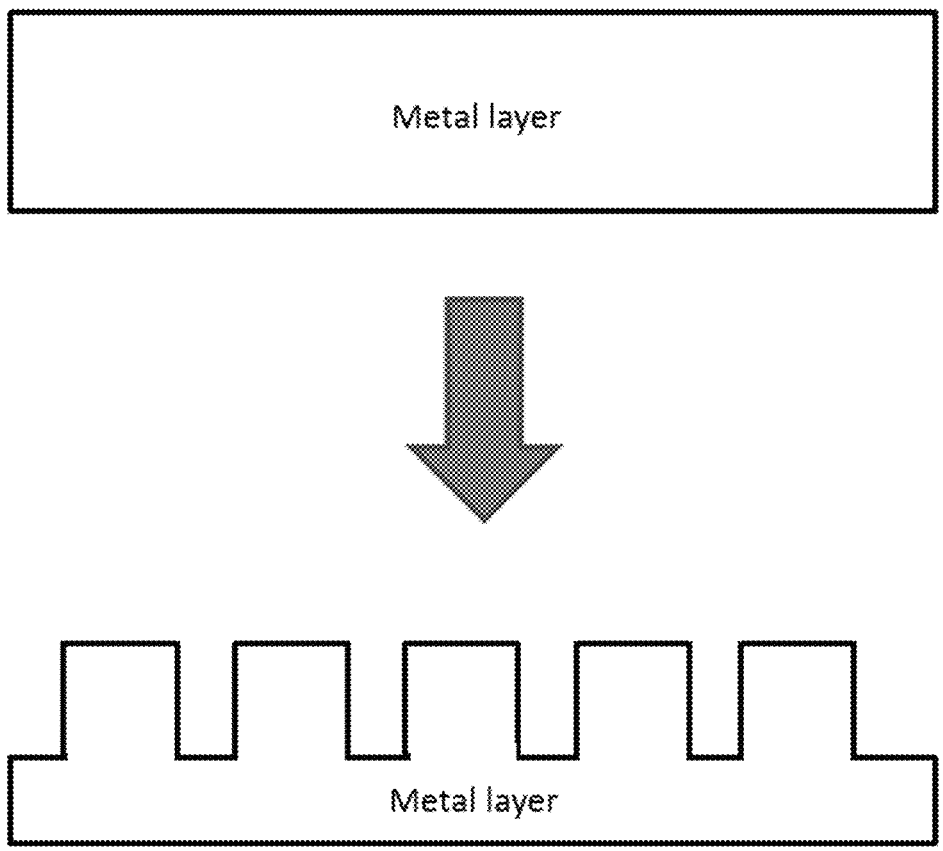
FIG. 8 shows a metal thin film (i.e., an electrode layer) that has been etched partially through the film thickness to produce a corrugated top surface while maintaining a planar bottom surface according to an embodiment of the disclosed subject matter.

The gap of 0 nm may be achieved without the use of nanoparticles. In an example device, shown in FIG. 8, a planar metal film may be etched partially through the film thickness to form a corrugated top surface, while the bottom surface of the film may be planar. This may be accomplished, for example, by using focused ion beam milling. The corrugation processing may be performed on a metal attached to a completed OLED device, or on a separate substrate from which the corrugated metal may be delaminated and attached to the OLED, or upon which the OLED may be grown.

Figure 9:
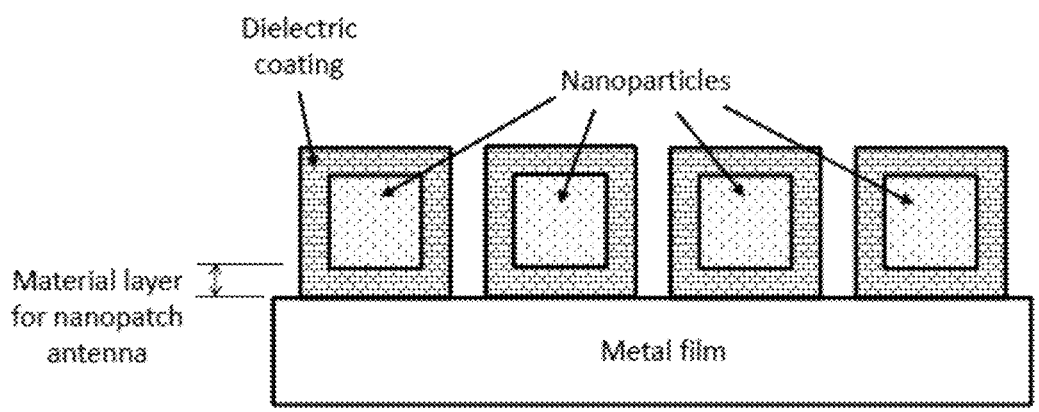
FIG. 9 shows that a nanoparticle coating may provide an appropriate gap thickness between the nanoparticle and the metal film according to an embodiment of the disclosed subject matter.

In another embodiment of the disclosed subject matter, the nanoparticles may be individually coated with a dielectric material to serve as part, or all, of the gap spacing (e.g., by a material), as shown in FIG. 9. For example, the particles may be coated with the entire gap thickness desired, thereby reducing the gap layer to zero. In another example, a combination of gap layer thickness plus nanoparticle coating may be achieve the desired total spacer thickness. The nanoparticle coating may act as an adhesion layer to improve nanoparticle adhesion to or increase nanoparticle density on the layers onto which they will be deposited.

Figure 10:
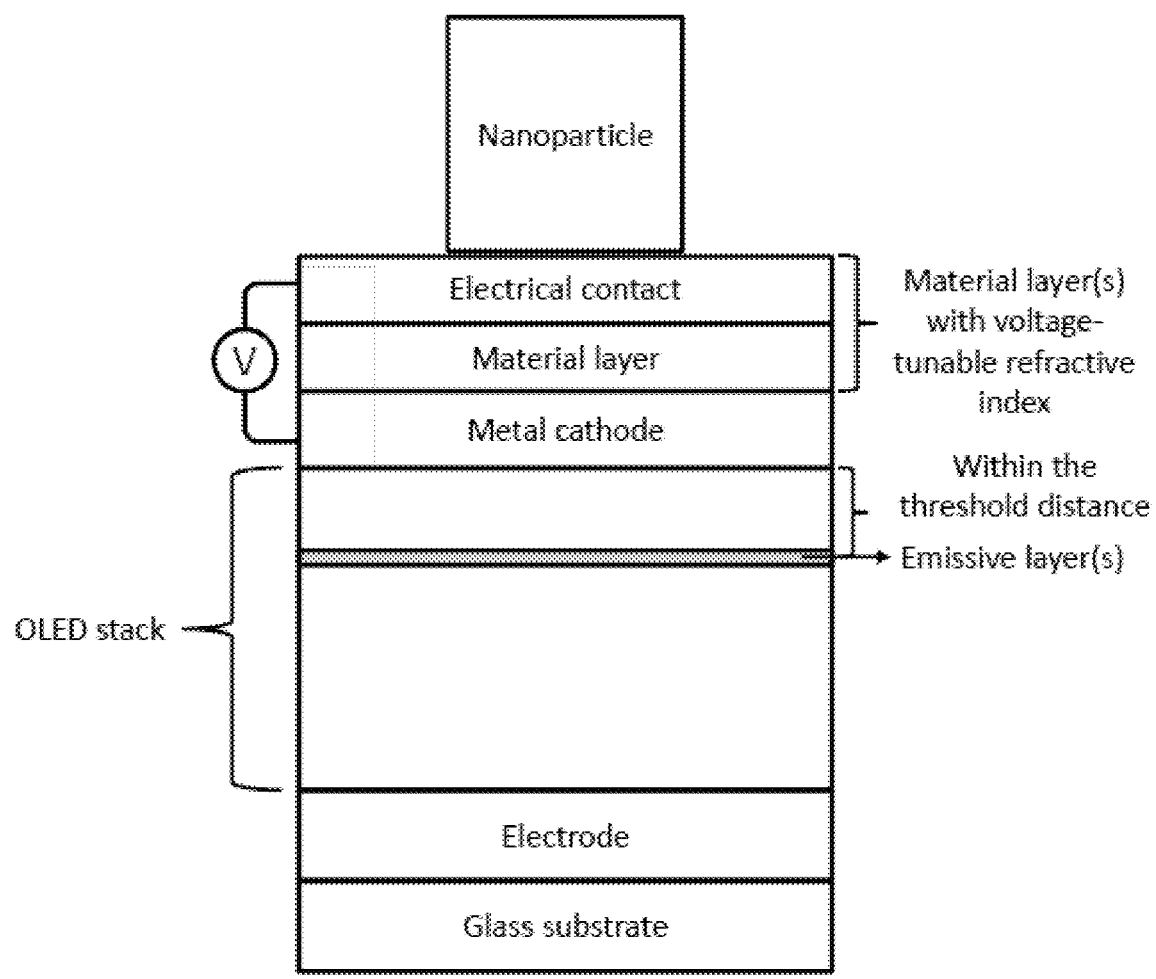
FIG. 10 shows an OLED combined with the nanopatch antenna utilizing a gap material(s) with voltage-tunable refractive index for selecting the wavelength of emitted light according to an embodiment of the disclosed subject matter.

Since the refractive index of the gap layer(s) may affect the resonance of the nanopatch antenna, using gap materials that have voltage-tunable refractive index may provide a way to tune the emission spectrum with voltage applied between the metal cathode and an electrical contact layer beneath the nanoparticle, as shown in FIG. 10. That is, FIG. 10 shows schematically an OLED combined with the nanopatch antenna utilizing a gap material(s) with voltage-tunable refractive index for selecting the wavelength of emitted light. In one example, aluminum-doped zinc oxide may be used as the voltage-tunable refractive index material since its permittivity is varied when an applied voltage modifies the carrier concentration. In this case, a second insulating layer may be used in the gap to build the charge. In some embodiments, the secondary insulating layer may be removed, depending on the material properties of the voltage-tunable refractive index layer. This may be useful when the OLED stack is a white OLED, i.e., containing red, green, and blue emission, since the voltage-tunable nanopatch resonance may act as a color filter to selectively pass the desired color. This effectively converts the OLED into a three-terminal device, with the voltage applied between the anode and cathode operating the OLED, and the voltage applied between the cathode and the electrical contact layer beneath the nanoparticle tuning the nanopatch resonance to select the emitted color.

That is, according to the embodiments shown in at least FIGS. 3a-10, a device may include an emissive layer, a first electrode layer, a plurality of nanoparticles, and a material disposed between the first electrode layer and the plurality of nanoparticles. The first electrode layer of the device may have a thickness from 5 nm to 300 nm.

The device may include a second electrode layer and a substrate, where the second electrode layer may be disposed on the substrate, and the emissive layer may be disposed on the second electrode layer. At least one of the first electrode layer and the second electrode layer may be a metal, a semiconductor, and/or a transparent conducting oxide. The first electrode layer may be spaced from the emissive layer by a predetermined threshold distance that is a distance at which a total non-radiative decay rate constant is equal to a total radiative decay rate constant. The material of the device may include at least one of organic material, oxides, and/or dielectric material. The material may have a refractive index from 1-5. The emissive layer of the device may include a transport layer. The emissive layer may be an organic layer with emitter molecules.

The emissive layer of the device may include at least one of a fluorescent material, a phosphorescent material, a thermally-activated delayed fluorescence (TADF) material, a quantum dot material, metal-organic frameworks, covalent-organic frameworks, and/or perovskite nanocrystals.

The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer is selected to tune a plasmonic resonance wavelength of the plurality of nanoparticles or a nanopatch antenna. A shape of the plurality of nanoparticles may be at least one of cubes, spheres, spheroids, cylindrical, parallelpiped, rod-shaped, star-shaped, pyramidal, and/or multi-faceted three-dimensional objects. A size of at least one of the plurality of nanoparticles may be from 5 nm to 1000 nm.

The device may include a corrugated layer disposed on the substrate, where the second electrode layer, the emissive layer, the first electrode layer, and the material are correspondingly corrugated, as shown in FIG. 5b.

The material of the device may include a dielectric layer disposed on the first electrode layer, and an electrical contact layer disposed on the dielectric layer. The material may include a voltage-tunable refractive index material between the electrical contact layer and the first electrode layer. The voltage-tunable refractive index material may be aluminum-doped zinc oxide. The material may include an insulating layer. The first electrode layer of the device may be spaced from the emissive layer by a predetermined threshold distance. As discussed above, the predetermined threshold distance may be a distance at which a total non-radiative decay rate constant is equal to a total radiative decay rate constant.

In some embodiments, the device may include an additional layer disposed on the plurality of nanoparticles. The additional layer may include one or more emitter molecules. The additional layer may match a refractive index beneath the first electrode layer. The additional layer may have a thickness of 1000 nm or less.

A nanopatch antenna (NPA) may include a planar metal film (e.g., an electrode layer), a gap material (e.g., a dielectric material or the like) disposed on top of the planar metal, and a nanoparticle placed atop the gap material (e.g., as shown in FIG. 3a). This configuration results in a resonant plasmon mode due to the high electric field intensity created in the gap medium. This large electric field may be used to enhance the emission rate of an emitter placed in the gap, known as the Purcell effect which, in turn, will stabilize the emitter to detrimental processes that rely on the emitter being in the excited state. The nanopatch antenna may radiate out the energy from this plasmonically-active mode with efficiencies up to 50%. Previous NPA designs have typically been optically pumped (for example, by a laser).

Figure 11:
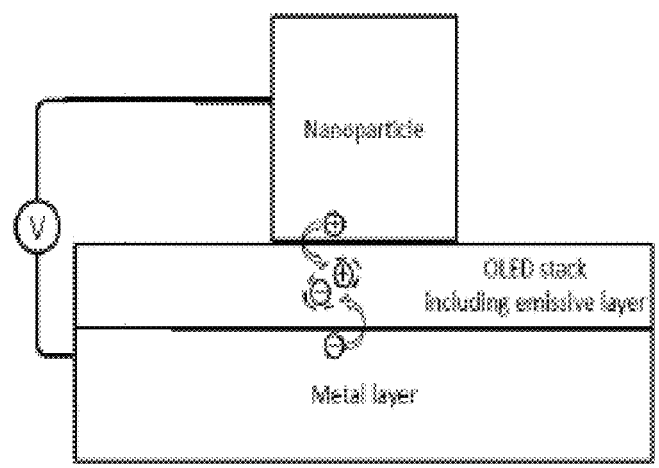
FIG. 11 shows an OLED stack deposited within the gap region, and using the nanoparticle and metal layer as electrodes to inject charge according to an embodiment of the disclosed subject matter.

In embodiments of the disclosed subject matter, an OLED stack may be disposed within the NPA gap, and the nanoparticle and planar metal may provide as electrical injection pathways to the device, as shown in FIG. 11. Traditionally, it was not expected that an OLED that is 5 to 20 nm thick would work, due to quenching to non-radiative modes. However, the large Purcell enhancement may enable fast coupling of the phosphor to the radiative mode, out-competing the loss processes that would normally be present in an OLED that is 5 to 20 nm thick.

Since typical NPA gap thicknesses are about 2-15 nm, it may seem infeasible to fabricate an entire OLED stack that maintains high internal quantum efficiency within the nanopatch antenna gap. The large electric fields present in NPA gaps of this thickness may be able to enhance the emission rate of an emitter placed in the gap by a factor of 1000. As discussed above, Purcell factors on the order of 10 may be sufficient for an enhancement in OLED emitter stability (e.g., phosphorescent OLED stability). In embodiment of the disclosed subject matter, some of the Purcell enhancement may be traded for a thicker NPA gap more amenable to an OLED stack approximately 5-100 nm in thickness.

Figure 12A:
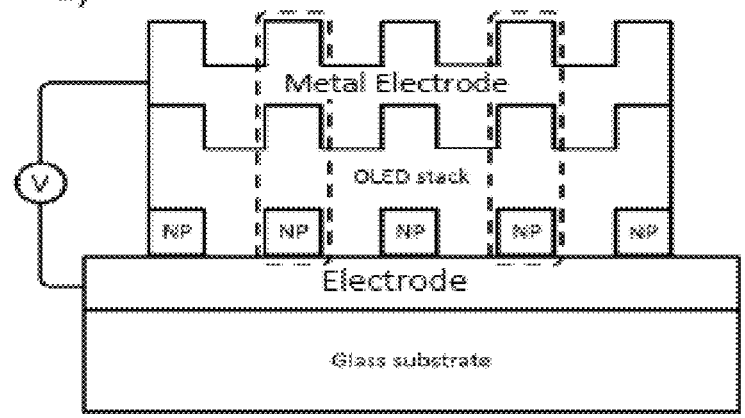
FIG. 12a shows a nanopatch antenna OLED device having metal nanoparticles deposited on top of an electrode and substrate, thereby allowing charge injection from both the ITO (indium tin oxide) and metal nanoparticles according to an embodiment of the disclosed subject matter.

It may seem infeasible to inject charge through a metal nanoparticle typically on the order of 5 nm to 1000 nm in size. Embodiments of the disclosed subject matter provide devices to address this. FIG. 12a shows an indium tin oxide (ITO) coated glass substrate upon which metal nanoparticles, typically Ag, Al, or Au, have been dispersed. In one example device, these nanoparticles may have been drop cast or spin cast from solution. In another example, the nanoparticles may have been processed directly on the substrate via photolithography and subsequent metal liftoff. The OLED stack may be deposited atop the metal nanoparticles and capped with a metal electrode, typically Ag, Al, or Au. This may form a corrugated device structure, as shown in FIG. 12a.

Figure 12B:
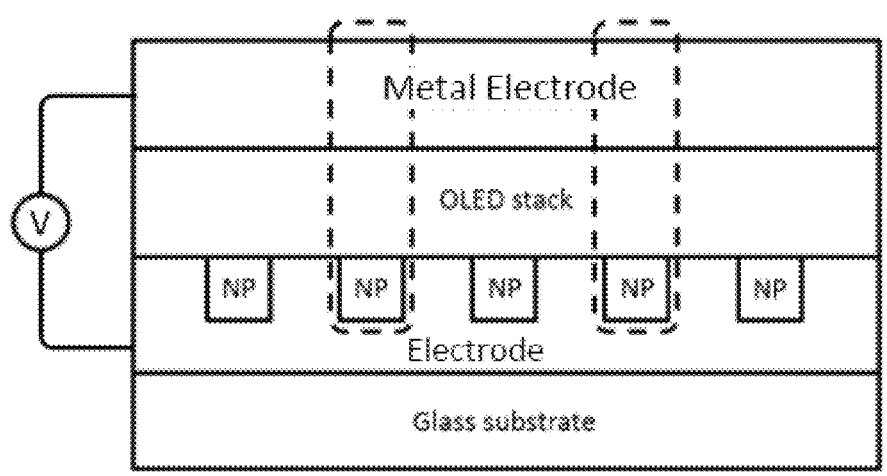
FIG. 12b shows an alternative planar OLED device to that shown in FIG. 12a according to an embodiment of the disclosed subject matter.

For applications where corrugation is undesirable, a device such as shown in FIG. 12b may be used. To form this device, the nanoparticle features are etched into the ITO, but not all the way through the ITO layer. In one example, the etching may be performed by a reactive ion etcher due to the directional nature of the etching process.

Figure 13:
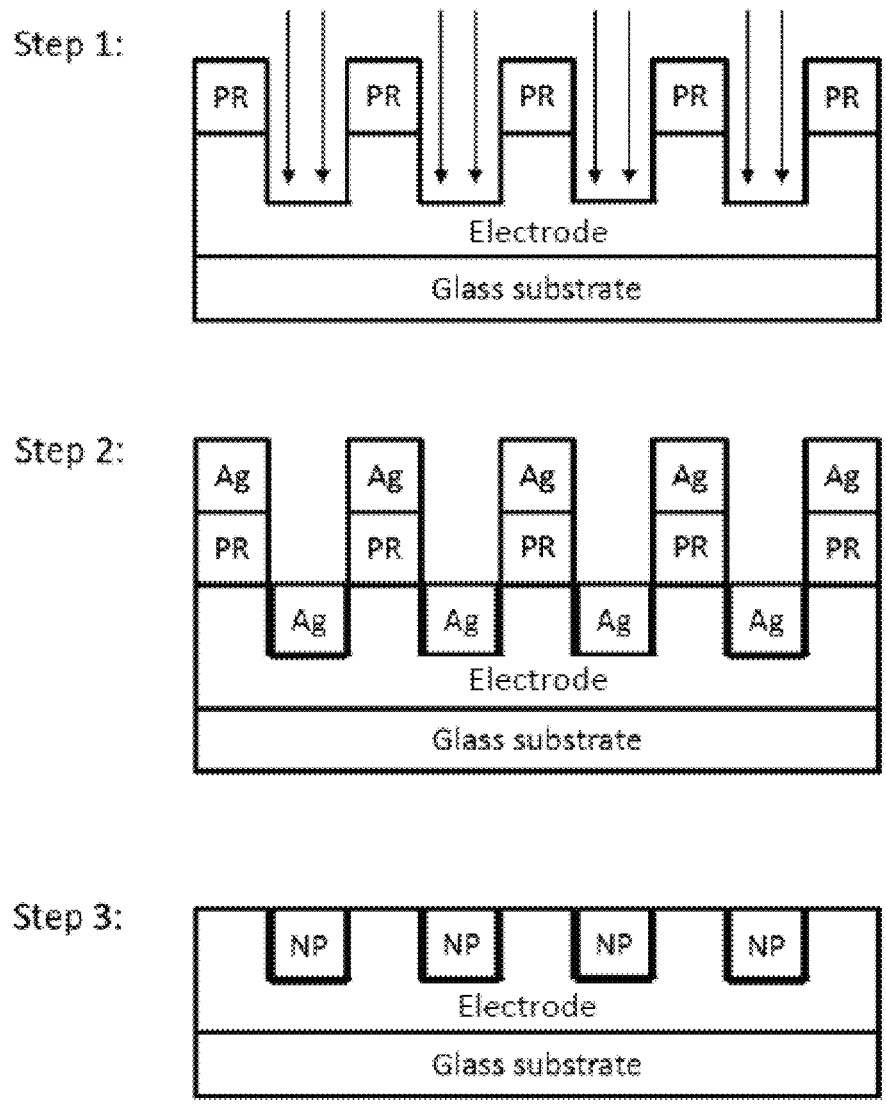
FIG. 13 shows a method of forming a planar electrically-driven nanopatch antenna OLED as shown in FIG. 12b according to an embodiment of the disclosed subject matter.

As shown in FIG. 13, a thickness of metal may be deposited matching the depth of the ITO etch, and liftoff of the metal (Ag) on photoresist (PR) may be performed. This may result in metal nanoparticles (NP) that are flush with the top surface of the ITO. The OLED stack may then be grown on this planar substrate, and a planar metal deposited as the top contact, to form the NPA OLED structure. Injection of charge into the OLED can occur from either the nanoparticles or the ITO.

In FIGS. 12a-12b, two individual NPAs are highlighted in dashed boxes. In the case that the nanoparticles as far enough apart from each other such that there is no coupling between nanoparticles, each NPA operates independently. In this case, the electric field (and hence, Purcell enhancement) may be higher for emitter molecules located within an individual NPA than outside of it. This may result in some variation in emitter rate spatially throughout the OLED emissive layer, but because the metal contact is in close proximity to all the emitter molecules in the stack, all emitter molecules will sense an increased density of photonic states, and therefore experience Purcell enhancement. When the nanoparticles are formed into an array such that coupling between nanoparticles can occur, it may result in a hybrid, spatially-delocalized mode that can reduce the variation in the Purcell enhancement. In some embodiments, the nanoparticles may be close enough that they form a hybridized mode. In another embodiment, the nanoparticles may not hybridize.

In some embodiments, the nanoparticles may be cubes, spheres, spheroids, cylindrical, parallelepiped, and/or rod-like. The nanoparticles may vary in size from 5 nm to 1000 nm, and more preferably from 5 nm to 200 nm. The nanoparticles may be dielectric, semiconductor, or metallic.

The gap material may be a dielectric or semiconductor and have a refractive index from 1 to 15. The gap material may include at least one light emitting material, which may be fluorescent, phosphorescent, thermally-activated delayed fluorescence (TADF), or a quantum dot. In some embodiments, there may be many light emitting materials of one or more types. The gap may include a host material. The gap may include may include a plurality of layers of material or may be only 1 layer. In some embodiments, the gap material may include a mixture of materials. The gap may range in thickness from 0.1 nm to 100 nm.

The planar metal film may be pure or an alloy, preferably of Ag, Al, Ag—Al alloys, or Au. Some other materials include, but are not limited to Ir, Pt, Ni, Cu, W, Ta, Fe, Cr. The top side of the planar film may be patterned with additional material. The top of the metal film may have an additional material on it; this material may include a light emitting element, including quantum dots.

That is, in the embodiments shown in FIGS. 11-12b, a device may include an emissive layer, a first electrode layer, a plurality of nanoparticles, and a material disposed between the first electrode layer and the plurality of nanoparticles. The material of the device may include the emissive layer. The plurality of nanoparticles and the first electrode layer may provide an electrical injection pathway to the device. The device may include a substrate and a second electrode layer, where the first electrode layer may be non-planar, where the second electrode layer may be disposed on the substrate, and the plurality of nanoparticles may be disposed on the second electrode layer, where the emissive layer may be non-planar and may be included in the material, and may be disposed on and conforms to the plurality of nanoparticles and the second electrode layer, and where the first electrode layer may be disposed on and conforms to the non-planar emissive layer. At least one of the first electrode layer and the second electrode layer may be a metal, a semiconductor, and/or a transparent conducting oxide.

As shown in FIG. 13, the method include disposing a first electrode layer on a substrate, disposing photoresist on the first electrode layer, etching at least a portion of the photoresist and the first electrode layer, depositing a metal on the portions of the photoresist that remain, and to match the depth of the etched portion of the first electrode layer, removing the metal and the photoresist so as to form nanoparticles from the deposited metal that are flush with a surface of the first electrode layer, disposing an emitting layer on the first electrode layer and the nanoparticles, and disposing a second electrode layer on the emitting layer.

Embodiments of the disclosed subject matter provide improved organic light emitting diode (OLED) performance by using nanostructures having one or more different geometries, shapes, materials, and/or lattice symmetries. The nanostructures may enhance emission rates, increase surface plasmon polariton (SPP) mode out-coupling, improve device stability, and/or provide a far-field radiation pattern.

For efficient coupling of an excited state energy into a plasmon mode, an emitter or emissive layer may be placed within a threshold distance of a structure and/or layer(s) that increase the photonic density of states (as shown in FIGS. 14a-14f), subsequently resulting in an enhanced emission rate, known as the above-described Purcell effect. As discussed above, the threshold distance may be a distance at which the total non-radiative decay rate constant is equal to the total radiative decay rate constant.

Figure 14A:
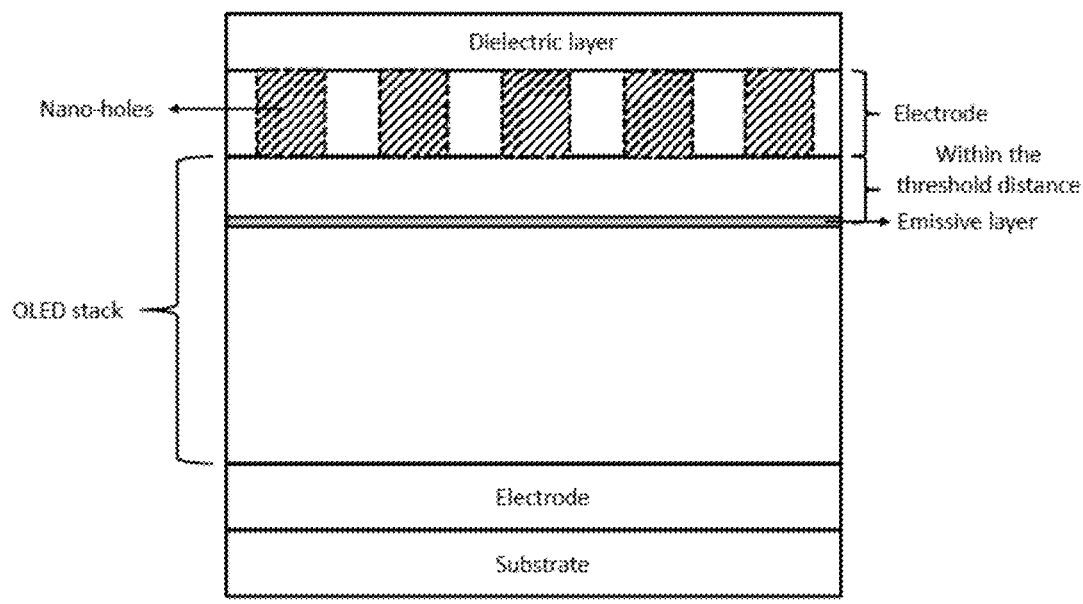
FIG. 14a-14f show example show examples of OLED devices with various nanostructures, either with or without a dielectric capping layer, according to embodiments of the disclosed subject matter.
Figure 14B:
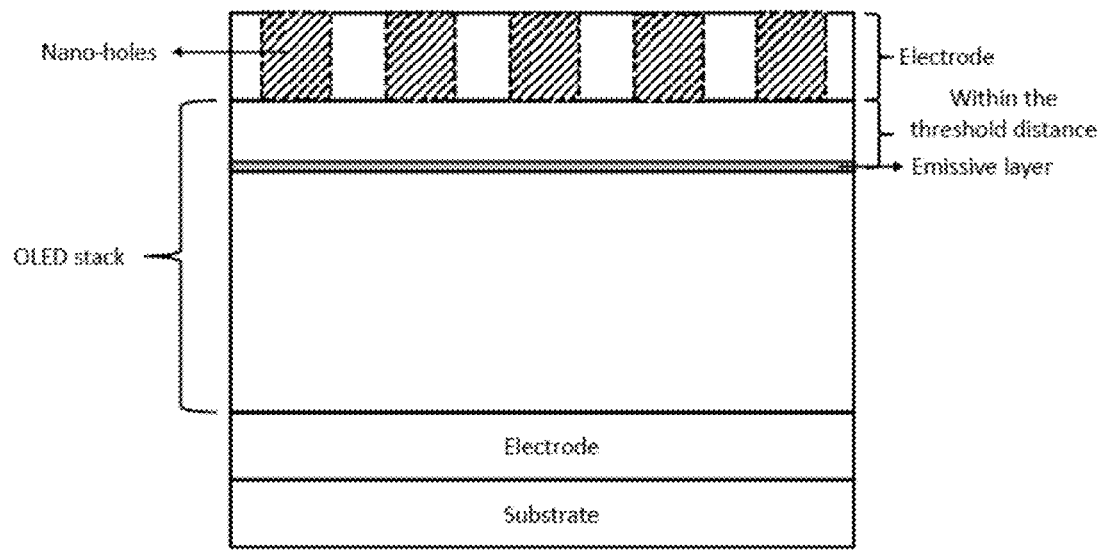
Figure 14C:
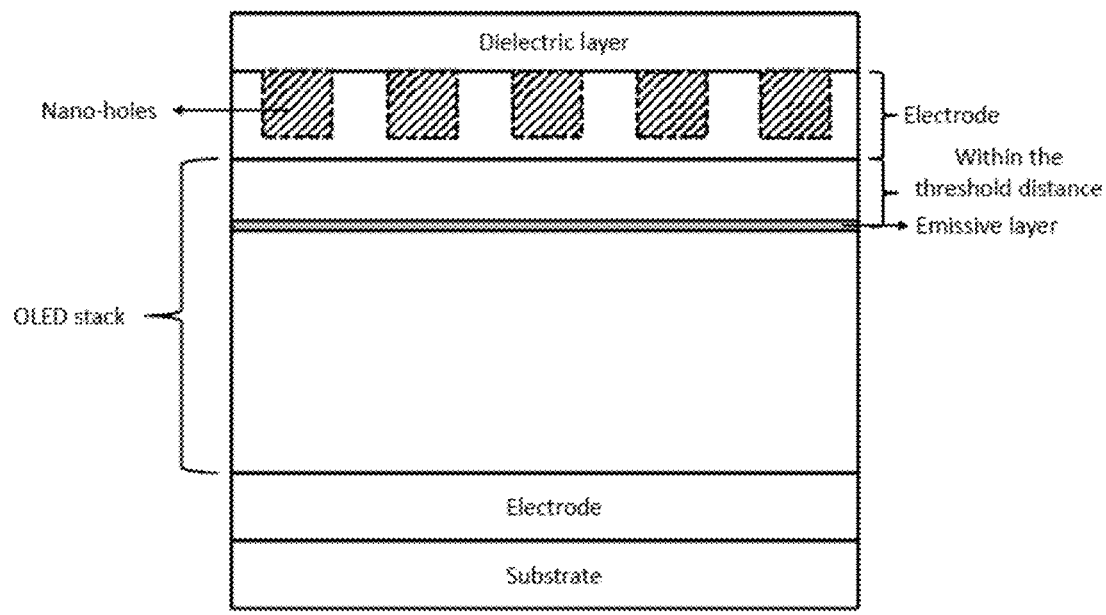
Figure 14D:
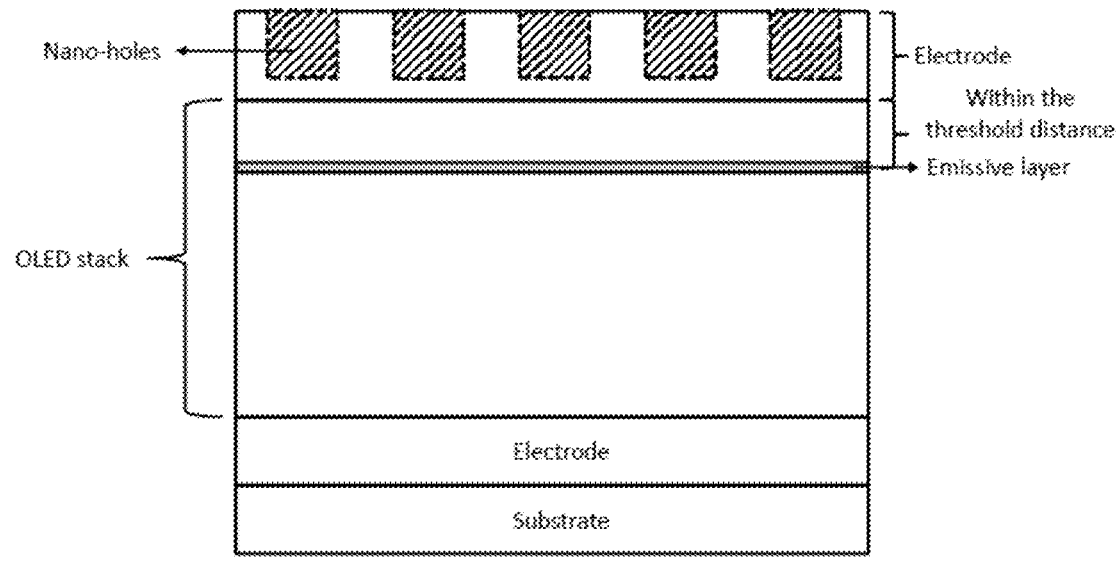
Figure 14E:
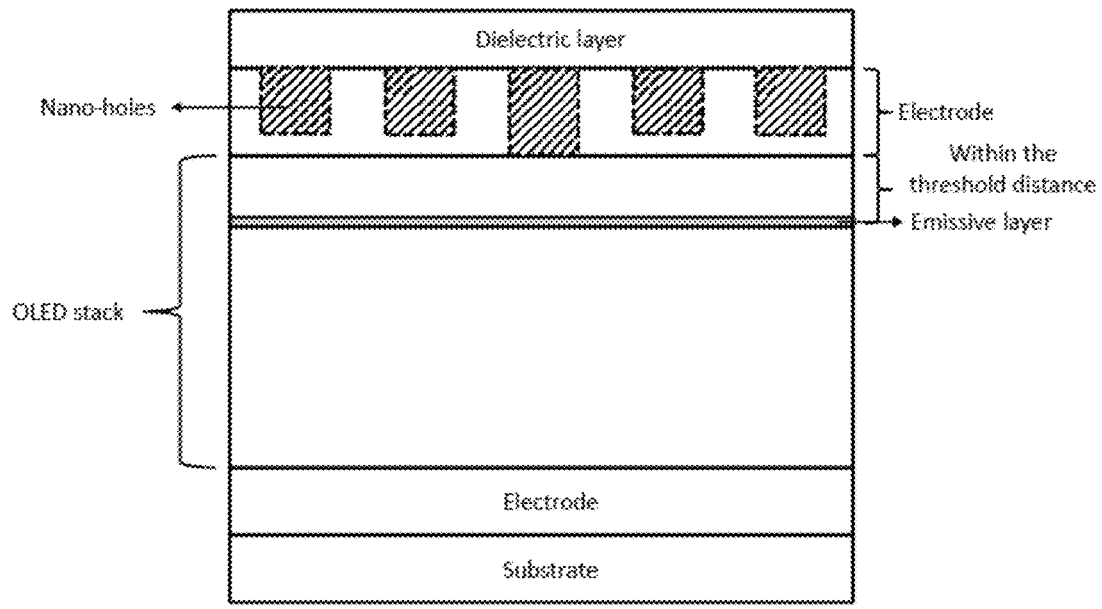
Figure 14F:
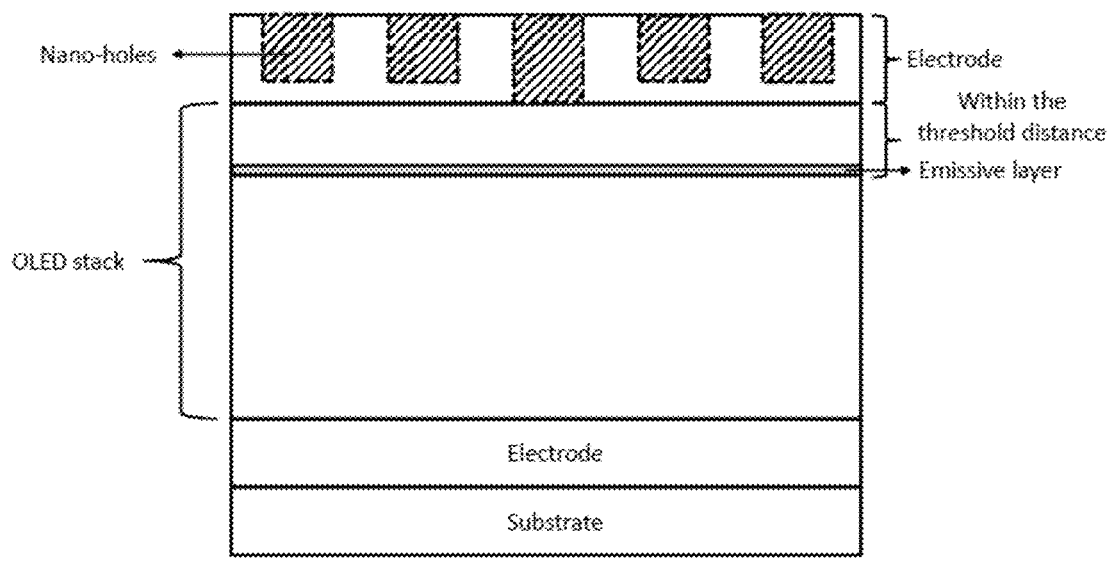

The example devices in FIGS. 14a-14f show variations of the nanostructured cathode (cross-section view) according to embodiments of the disclosed subject matter. These include nano-holes (which may also be referred to as nanostructures) that may be etched all the way through the metal film (shown in FIGS. 14a, 14b), partially through the metal film (shown in FIGS. 14c, 14d), or where some holes may be etched fully through the metal film while others are only partially etched (shown in FIGS. 14e, 14f). FIGS. 14a-14f show variations in which the nanostructured cathode is capped with a dielectric layer (as shown in FIGS. 14a, 14c, 14e) or without a dielectric layer (as shown in FIGS. 14b, 14d, 14f) for the purpose of matching the refractive index to that beneath the cathode to improve cross-coupling of the surface plasmon mode across the metal film's thickness. The profile of the hole (nanostructure), i.e., whether the hole edge and/or sidewall may be perpendicular to the film's surface or if the sidewall of the hole has a radius of curvature, may be used to tune the properties of the nanostructured array.

Figure 15:
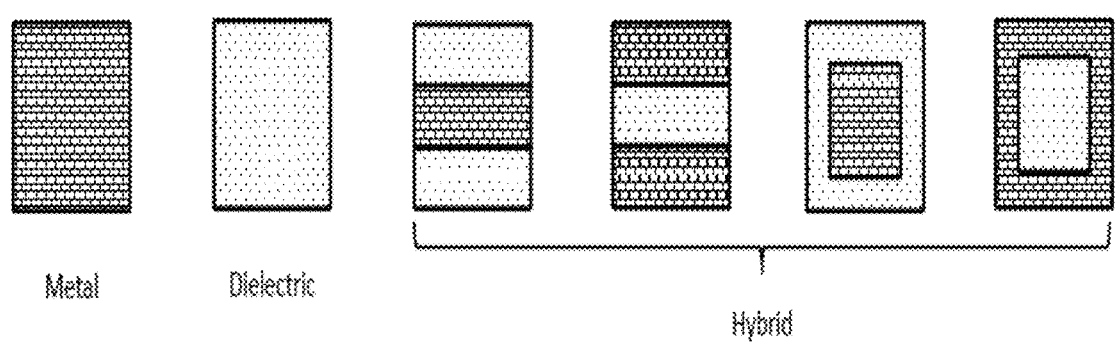
FIG. 15 shows how a material composition of the nanostructures may be metal, dielectric, or some combination (i.e., a hybrid) of the two according to an embodiment of the disclosed subject matter.

The nanostructures may be made of metals, dielectrics or some combination of these. FIG. 15 shows some examples of different possible combinations according to embodiments of the disclosed subject matter. The use of composites (e.g., a metal and a dielectric) provides flexibility in the device design, as a resonant frequency of a localized mode may be tuned and/or selected by the composite used. For each of these material, the localized electromagnetic mode may be tuned. Typical metals used include, but are not limited to: Ag, Al, Au, Ir, Pt, Ni, Cu, W, Ta, Fe, Cr, Mg, Ga, Rh, Ti, Ru, Pd, In, Bi, and/or Ca, and may include stacks and/or alloys of these materials. Dielectrics used may include, but are not limited to: organic material, titania, silicon dioxide, silicon nitride, aluminum oxide, zinc oxide, nickel oxide, germanium oxide, lithium fluoride, magnesium fluoride, and/or molybdenum oxide.

Figure 16:
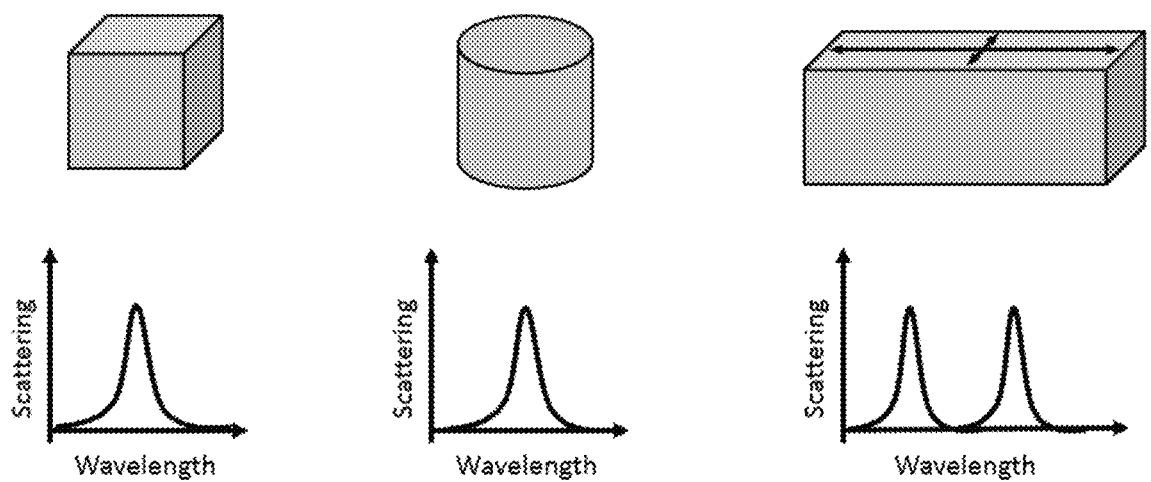
FIG. 16 shows that particle shape may affects the resonant plasmon mode frequency according to embodiments of the disclosed subject matter.

The localized electromagnetic resonance of a nanostructure or a portion of the nanostructure may be tuned by a shape of the nanostructure. The shape may include any cylindrical, spherical, and/or cubic shape, or any shape that has single or multiple localized resonances, as shown in FIG. 16. A radius of curvature for edges and/or corners in faceted nanostructures may be used to tune the resonant frequency of the nanostructure. Examples of some multiple-localized-resonance shapes may include ellipses and rectangles that support multiple modes with different frequencies induced by the asymmetry of the nanostructure. For example, FIG. 16 shows how differing length and/or width of a rectangular nanostructure may result in two distinct resonant frequencies. These multiple-frequency nanostructures may provide enhanced outcoupling for multi-wavelength or white emission OLEDs.

That is, in the embodiments shown in FIGS. 14a-16, a device may include an emissive layer, a first electrode layer, a plurality of nanoparticles, and a material disposed between the first electrode layer and the plurality of nanoparticles. The device may include a substrate and a second electrode layer, the material is a first dielectric layer, and a second dielectric layer, where the second electrode layer is disposed on the substrate, the emissive layer is disposed on the second electrode layer, the first electrode layer is disposed on the emissive layer, the first dielectric layer is disposed on the first electrode layer, the plurality of nanoparticles are disposed on the first dielectric layer, and the second dielectric layer is disposed on the plurality of nanoparticles and the first dielectric layer. At least one of the first electrode layer and the second electrode layer may be a metal, a semiconductor, and/or a transparent conducting oxide. The second electrode layer may be spaced from the emissive layer by a predetermined threshold distance that is a distance at which a total non-radiative decay rate constant is equal to a total radiative decay rate constant. The material may include at least one selected from the group consisting of: organic material, oxides, and dielectric material. The material may have a refractive index from 1-5. The emissive layer may include a transport layer. The emissive layer may be an organic layer with emitter molecules. The emissive layer may include at least one of a fluorescent material, a phosphorescent material, a thermally-activated delayed fluorescence (TADF) material, a quantum dot material, metal-organic frameworks, covalent-organic frameworks, and perovskite nanocrystals. The first electrode layer may have a thickness from 5 nm to 300 nm.

The device may include a nanopatch antenna, where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer is selected to tune a plasmonic resonance wavelength of the plurality of nanoparticles or a nanopatch antenna. A shape of the plurality of nanoparticles may be at least one of cubes, spheres, spheroids, cylindrical, parallelpiped, rod-shaped, star-shaped, pyramidal, and/or multi-faceted three-dimensional objects. A size of at least one of the plurality of nanoparticles may be from 5 nm to 1000 nm.

The device may include a substrate and a second electrode layer, where the material may be a first dielectric layer, where the second electrode layer may be disposed on the substrate, the emissive layer may be disposed on the second electrode layer, the first electrode layer may be disposed on the emissive layer, the first dielectric layer may be disposed on the first electrode layer, and the plurality of nanoparticles may be disposed on the first dielectric layer. At least one of the first electrode layer and the second electrode layer may be a metal, a semiconductor, and/or a transparent conducting oxide.

The device may include a substrate and a second electrode layer, where the material is a first dielectric layer, and a second dielectric layer, where the plurality of nanoparticles may be disposed in the second dielectric layer, and where the second dielectric layer and the plurality of nanoparticles may be disposed on the substrate, the first dielectric layer may be disposed on the second dielectric layer and the plurality of nanoparticles, the first electrode layer may be disposed on the first dielectric layer, the emissive layer may be disposed on the first electrode, and the second electrode may be disposed on the emissive layer. At least one of the first electrode layer and the second electrode layer may be a metal, a semiconductor, and/or a transparent conducting oxide.

The device may include a substrate and a second electrode layer, the material may be a first dielectric layer, a second dielectric layer, and the first electrode layer may be disposed on the substrate, the first dielectric layer may be disposed on the first electrode layer, the plurality of nanoparticles may be disposed on the first dielectric layer, the second dielectric layer may be disposed on the plurality of nanoparticles and the first dielectric layer, the emissive layer may be disposed on the second dielectric layer, and the second electrode layer may be disposed on the emissive layer.

The device may include a substrate and a second electrode layer, the material is a first dielectric layer, and a second dielectric layer, where the second electrode layer may be disposed on the substrate, the emissive layer may be disposed on the second electrode layer, the plurality of nanoparticles may be disposed on the emissive layer, the second dielectric layer may be disposed on the plurality of nanoparticles and the emissive layer, the first dielectric layer may be disposed on the second dielectric layer, and the first electrode layer is disposed on the first dielectric layer. At least one of the first electrode layer and the second electrode layer may be a metal, a semiconductor, and/or a transparent conducting oxide.

The material of the device may include at least one of organic material, oxides, and/or dielectric material. The material may include a first layer and a second layer, where the first layer is thicker than the second layer. The first layer may be a dielectric material, and the second layer may be a nanoparticle adhesion layer. The thickness of the first layer may be between 1 to 100 nm, and the thickness of the second layer may be less than 5 nm. The material may have a thickness of 1000 nm or less. The material of the device may have a refractive index from 1-5. The material may include a least a portion of a coating disposed on the plurality of nanoparticles. The coating disposed on the plurality of nanoparticles may be a dielectric coating.

The device may include a second electrode layer, where the emissive layer is included in an organic light emitting diode (OLED), and where the OLED is disposed between the first electrode layer and the second electrode layer. At least one of the first electrode layer and the second electrode layer may be a metal, a semiconductor, and/or a transparent conducting oxide. The emissive layer may include a transport layer. The emissive layer may be an organic layer with emitter molecules. The emissive layer may include at least one of fluorescent material, phosphorescent material, thermally-activated delayed fluorescence (TADF) material, a quantum dot material, metal-organic frameworks, covalent-organic frameworks, and/or perovskite nanocrystals.

The first electrode layer of the device may be spaced from the emissive layer by a predetermined threshold distance, wherein the threshold distance is a distance at which a total non-radiative decay rate constant is equal to a total radiative decay rate constant. The first electrode layer may include at least one of Ag, Al, Au, Ir, Pt, Ni, Cu, W, Ta, Fe, Cr, Mg, Ga, Rh, Ti, Ru, Pd, In, Bi, and/or Ca. The first electrode layer may be patterned with an additional material. The additional material may include a light emitting element of a fluorescent emitter, a phosphorescent emitter, quantum dots, metal-organic frameworks, covalent-organic frameworks, and/or perovskite nanocrystals. The first electrode layer may has a thickness from 5 nm to 300 nm. The first electrode layer of the device may have at least one nonplanar surface.

The device may include a nanopatch antenna, and where the resonance of the nanopatch antenna may be tunable by at least one of varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and/or varying the material of the first electrode layer.

The plurality of nanoparticles of the device may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material.

At least one of the plurality of nanoparticles of the device may include an additional layer to provide lateral conduction among the plurality of nanoparticles. The plurality of nanoparticles are coated with an oxide layer, where a thickness of the oxide layer is selected to tune a plasmonic resonance wavelength of the plurality of nanoparticles or a nanopatch antenna. The plurality of nanoparticles may be colloidally-synthesized nanoparticles formed from a solution. A shape of the plurality of the nanoparticles may be at least one of cubes, spheres, spheroids, cylindrical, parallelpiped, rod-shaped, star-shaped, pyramidal, and multi-faceted three-dimensional objects. A size of at least one of the plurality of nanoparticles may be from 5 nm to 1000 nm. The size of at least one of the plurality of nanoparticles may be from 5 nm to 200 nm. The size of at least one of the plurality of nanoparticles may be from 5 nm to 100 nm.

The device may include a substrate, a second electrode layer, where the second electrode layer may be disposed on the substrate, and the nanoparticles may be disposed in the second electrode layer, where the emissive layer may be included in the material, and may be disposed on the second electrode layer that includes the plurality of nanoparticles, and where the first electrode layer is disposed on the emissive layer. At least one of the first electrode layer and the second electrode layer may be a metal, a semiconductor, and/or a transparent conducting oxide.

Devices fabricated in accordance with embodiments of the disclosed subject matter be incorporated into a wide variety of electronic component modules (or units) that may be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degrees C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," or "halide" are used interchangeably and refer to fluorine, chlorine, bromine, and iodine.

The term "acyl" refers to a substituted carbonyl radical (C(O)—$R_S$).

The term "ester" refers to a substituted oxycarbonyl (—O—C(O)—$R_S$ or —C(O)—O—$R_S$) radical.

The term "ether" refers to an —O$R_S$ radical.

The terms "sulfanyl" or "thio-ether" are used interchangeably and refer to a —S$R_S$ radical.

The term "sulfinyl" refers to a —S(O)—$R_S$ radical.

The term "sulfonyl" refers to a —SO$_2$—$R_S$ radical.

The term "phosphino" refers to a —P($R_S$)$_3$ radical, wherein each $R_S$ can be same or different.

The term "silyl" refers to a —Si($R_S$)$_3$ radical, wherein each $R_S$ can be same or different.

In each of the above, $R_S$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_S$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si and Se, preferably, O, S or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si and Se, preferably, O, S or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si and Se. In many instances, O, S or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., Angew. *Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the emissive dopant can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer.

In some embodiments, the organic layer may contain a phosphorescent sensitizer in an OLED where one or multiple layers in the OLED contains an acceptor in the form of one or more fluorescent and/or delayed fluorescence emitters. In some embodiments, the sensitizer can be one component of an exciplex. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv C-C_nH_{2n+1}$, $Ar_1$, $Ar_1-Ar_2$, and $C_nH_{2n}-Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

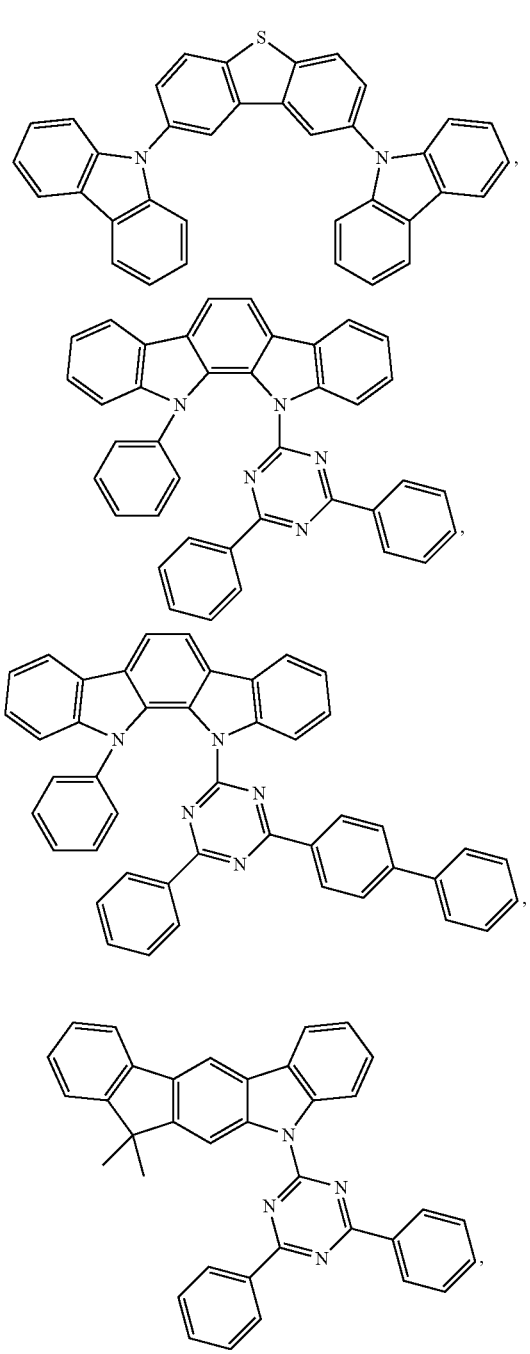

31
-continued
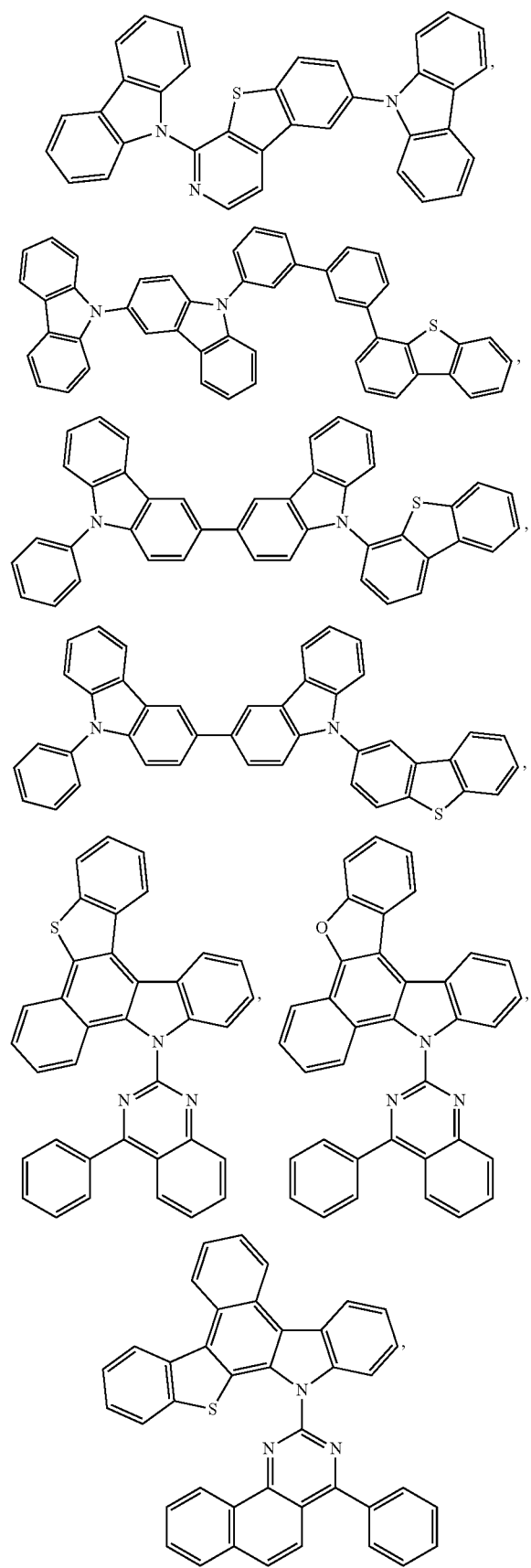
32
-continued
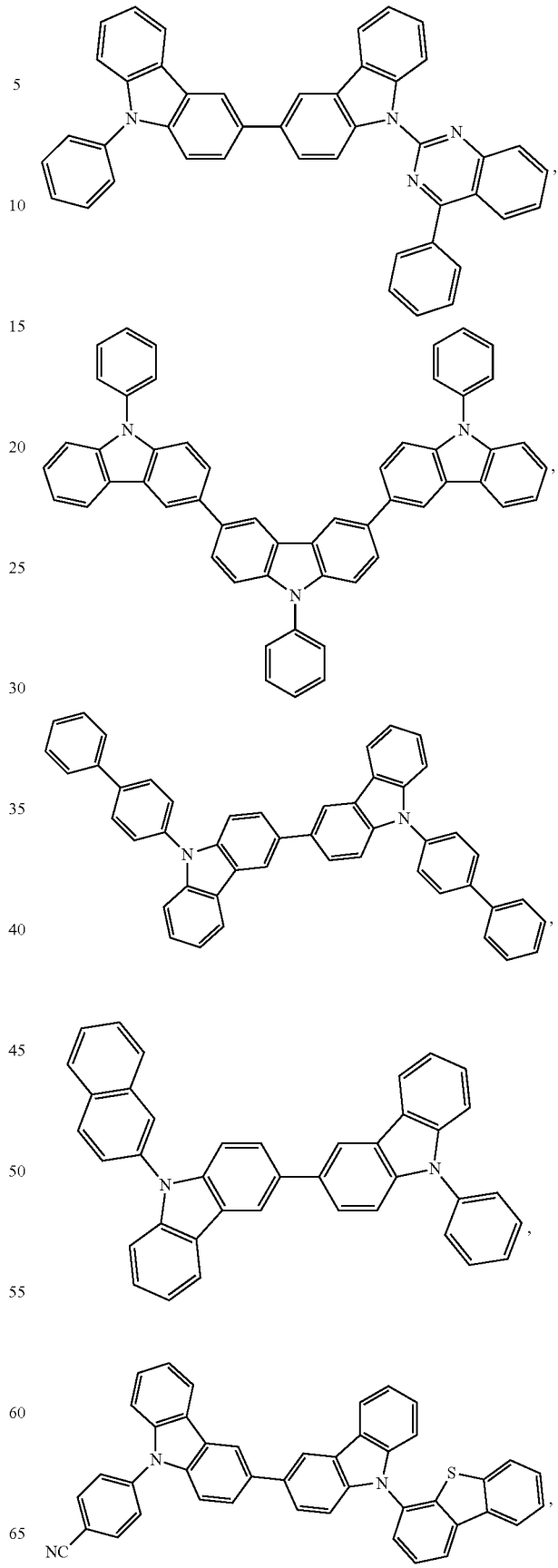

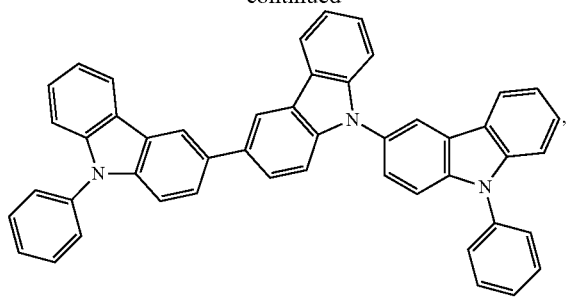

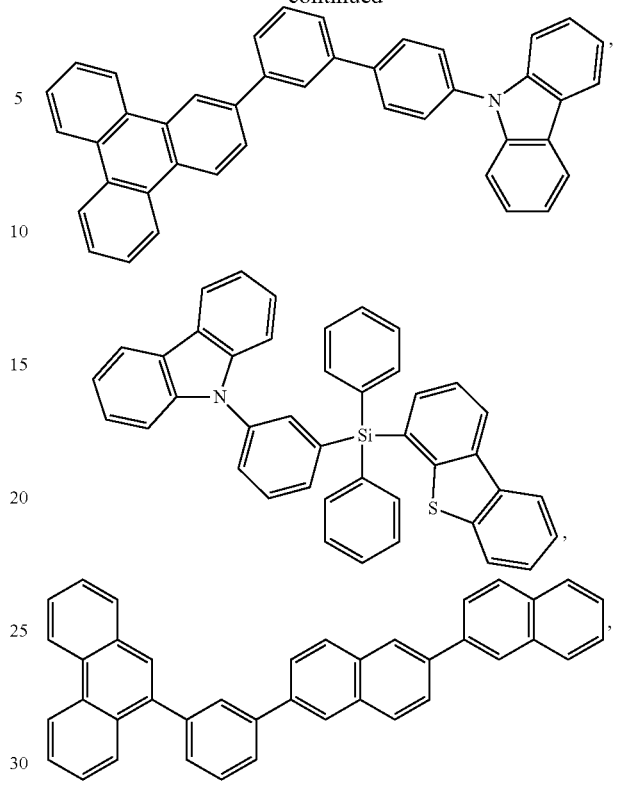

and combinations thereof.

Additional information on possible hosts is provided below.

Combination with Other Materials

The OLED disclosed herein can be incorporated The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

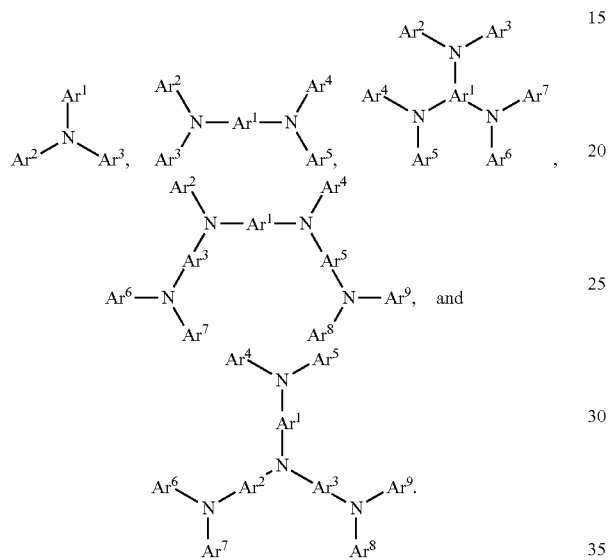

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

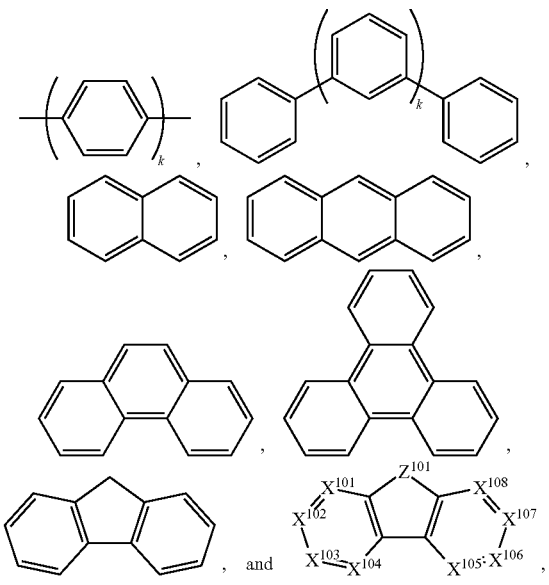

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

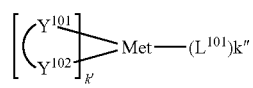

wherein Met is a metal, which can have an atomic weight greater than 40; $(Y^{101}\text{-}Y^{102})$ is a bidentate ligand, $Y^{101}$ and $Y_{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y_{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

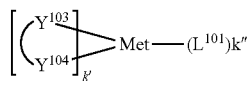

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k'' is the maximum number of ligands that may be attached to the metal.

In one aspect, the metal complexes are:

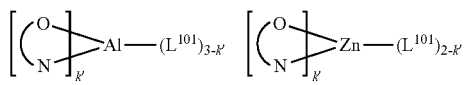

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

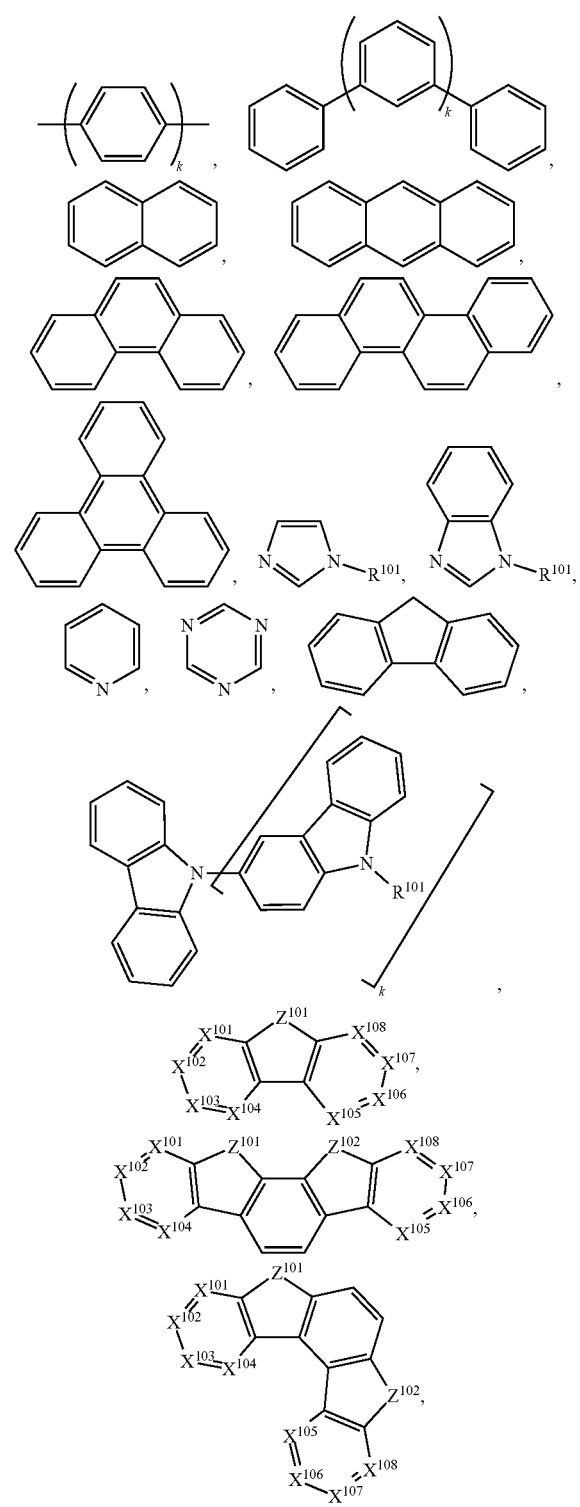

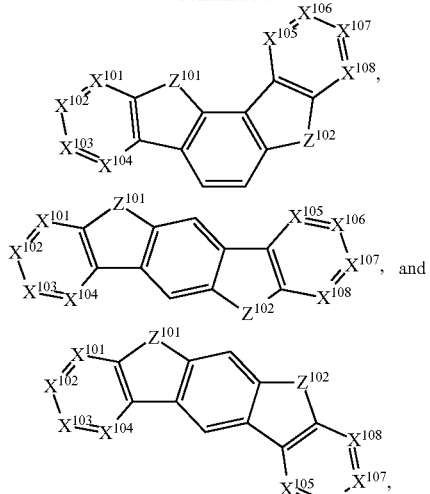

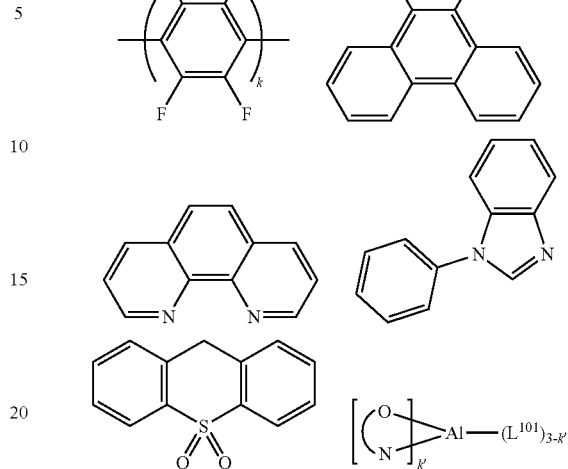

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Emitters:

One or more emitter dopants may be used in conjunction with the compound of the present disclosure. Examples of the emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

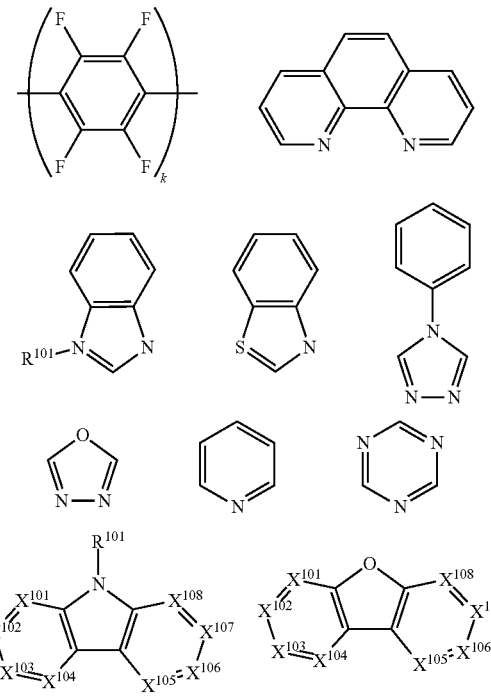

-continued

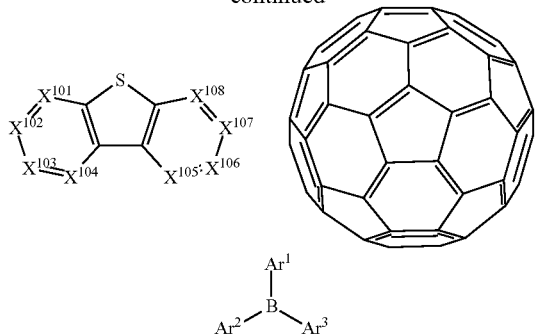

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

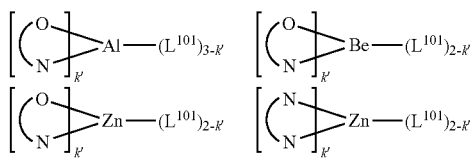

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Charge generation layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
an emissive layer;
a first electrode layer;
a plurality of nanoparticles; and
a material disposed between the first electrode layer and the plurality of nanoparticles,
wherein the plurality of nanoparticles are disposed over the emissive layer and the first electrode layer.

2. The device of claim 1, further comprising:
a second electrode layer; and
a substrate,
wherein the second electrode layer is disposed over the substrate, and the emissive layer is disposed over the second electrode layer.

3. The device of claim 2, wherein the first electrode layer is spaced from the emissive layer by a predetermined threshold distance that is a distance at which a total non-radiative decay rate constant is equal to a total radiative decay rate constant.

4. The device of claim 2, wherein the material includes at least one selected from the group consisting of: organic material, oxides, and dielectric material.

5. The device of claim 2, wherein the emissive layer is an organic layer with emitter molecules.

6. The device of claim 2, wherein the emissive layer includes at least one selected from the group consisting of: fluorescent material, phosphorescent material, thermally-activated delayed fluorescence (TADF) material, a quantum dot material, metal-organic frameworks, covalent-organic frameworks, and perovskite nanocrystals.

7. The device of claim 2, wherein a shape of the plurality of nanoparticles is selected from the group consisting of: cubes, spheres, spheroids, cylindrical, parallelpiped, rod-shaped, star-shaped, pyramidal, and multi-faceted three-dimensional objects.

8. The device of claim 2, wherein the material comprises:
a dielectric layer disposed on the first electrode layer; and
an electrical contact layer disposed on the dielectric layer.

9. The device of claim 1, further comprising an additional layer disposed on the plurality of nanoparticles.

10. The device of claim 1, further comprising:
a substrate; and
a second electrode layer;
wherein the material is a first dielectric layer;
wherein the second electrode layer is disposed on the substrate, the emissive layer is disposed over the second electrode layer, the first electrode layer is disposed over the emissive layer, the first dielectric layer is disposed over the first electrode layer, the plurality of nanoparticles are disposed over the first dielectric layer.

11. The device of claim 10, wherein the first electrode layer is comprised of at least one from the group consisting of: Ag, Al, Au, Ir, Pt, Ni, Cu, W, Ta, Fe, Cr, Mg, Ga, Rh, Ti, Ru, Pd, In, Bi, and Ca.

12. The device of claim 10, wherein the material includes at least one selected from the group consisting of: organic material, oxides, and dielectric material.

13. The device of claim 10, wherein the material has a refractive index from 1-5.

14. The device of claim 10, wherein the emissive layer is an organic layer with emitter molecules.

15. The device of claim 10, wherein the emissive layer includes at least one selected from the group consisting of: fluorescent material, phosphorescent material, thermally-activated delayed fluorescence (TADF) material, a quantum dot material, metal-organic frameworks, covalent-organic frameworks, and perovskite nanocrystals.

16. The device of claim 10, wherein the device comprises a nanopatch antenna, and wherein the resonance of the nanopatch antenna is tunable by at least one selected from the group consisting of: varying a size of the plurality of nanoparticles, varying a ratio of a size of the plurality of nanoparticles, varying a shape of the plurality of nanoparticles, changing a material of the plurality of nanoparticles, adjusting a thickness of the material, changing the refractive index of the material, changing the refractive index of an additional layer disposed on the plurality of nanoparticles, varying a thickness of the first electrode layer, and varying the material of the first electrode layer.

17. The device of claim 10, wherein the plurality of nanoparticles are formed from one selected from the group consisting of: Ag particles, Al particles, Au particles, dielectric material, semiconductor materials, an alloy of metal, a mixture of dielectric materials, a stack of one or more materials, and a core of one type of material and that is coated with a shell of a different type of material.

18. The device of claim 10, wherein at least one of the plurality of nanoparticles includes an additional layer to provide lateral conduction among the plurality of nanoparticles.

19. The device of claim 10, wherein the plurality of nanoparticles are coated with an oxide layer, wherein a thickness of the oxide layer is selected to tune a plasmonic resonance wavelength of the plurality of nanoparticles or a nanopatch antenna.

20. The device of claim 10, wherein a shape of the plurality of nanoparticles is at least one selected from the group consisting of: cubes, spheres, spheroids, cylindrical, parallelpiped, rod-shaped, star-shaped, pyramidal, and multi-faceted three-dimensional objects.

* * * * *